(12) United States Patent  
Redgrave et al.

(10) Patent No.: US 9,018,977 B2  
(45) Date of Patent: *Apr. 28, 2015

(54) USER REGISTERS IMPLEMENTED WITH ROUTING CIRCUITS IN A CONFIGURABLE IC

(71) Applicant: Tabula Inc., Santa Clara, CA (US)

(72) Inventors: Jason Redgrave, Mountian View, CA (US); Herman Schmit, Palo Alto, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/181,557

(22) Filed: Feb. 14, 2014

(65) Prior Publication Data

US 2014/0225642 A1    Aug. 14, 2014

Related U.S. Application Data

(63) Continuation of application No. 13/311,531, filed on Dec. 5, 2011, now Pat. No. 8,674,723, which is a continuation of application No. 12/702,290, filed on Feb. 8, 2010, now Pat. No. 8,089,300, which is a continuation of application No. 11/292,952, filed on Dec. 1, 2005, now Pat. No. 7,679,401.

(51) Int. Cl.  
*H03K 19/173*    (2006.01)  
*H03K 19/177*    (2006.01)

(52) U.S. Cl.  
CPC ...... *H03K 19/1776* (2013.01); *H03K 19/17744* (2013.01)

(58) Field of Classification Search  
USPC ................................. 326/37–41, 47  
See application file for complete search history.

(56) References Cited

U.S. PATENT DOCUMENTS

| | | |
|---|---|---|
| 4,980,577 A | 12/1990 | Baxter |
| 5,191,241 A | 3/1993 | McCollum et al. |
| 5,258,668 A | 11/1993 | Cliff et al. |
| 5,291,489 A | 3/1994 | Morgan et al. |
| 5,357,153 A | 10/1994 | Chiang et al. |
| 5,365,125 A | 11/1994 | Goetting et al. |
| 5,596,743 A | 1/1997 | Bhat et al. |
| 5,600,263 A | 2/1997 | Trimberger et al. |
| 5,610,829 A | 3/1997 | Trimberger |
| 5,629,637 A | 5/1997 | Trimberger et al. |
| 5,631,578 A | 5/1997 | Clinton et al. |
| 5,640,107 A | 6/1997 | Kruse |
| 5,656,950 A | 8/1997 | Duong et al. |
| 5,732,246 A | 3/1998 | Gould et al. |

(Continued)

OTHER PUBLICATIONS

Portions of prosecution history of U.S. Appl. No. 11/292,952, Jan. 27, 2010, Redgrave, Jason.

(Continued)

*Primary Examiner* — Jason M Crawford  
(74) *Attorney, Agent, or Firm* — Adeli LLP

(57) ABSTRACT

Some embodiments of the invention provide a configurable integrated circuit ("IC"). The configurable IC includes a set of configurable logic circuits for configurably performing a set of functions. The configurable IC also includes a set of configurable routing circuits for routing signals to and from the configurable circuits. During several operational cycles of the configurable IC, a set of data registers are defined by the configurable routing circuits. These data registers may be used wherever a flip-flop can be used.

20 Claims, 26 Drawing Sheets

(56) References Cited

U.S. PATENT DOCUMENTS

| | | | |
|---|---|---|---|
| 5,760,602 A | 6/1998 | Tan |
| 5,761,483 A | 6/1998 | Trimberger |
| 5,796,268 A | 8/1998 | Kaplinsky |
| 5,811,985 A | 9/1998 | Trimberger et al. |
| 5,883,525 A | 3/1999 | Tavana et al. |
| 5,914,616 A | 6/1999 | Young et al. |
| 5,940,603 A | 8/1999 | Huang |
| 5,944,813 A | 8/1999 | Trimberger |
| 6,018,559 A | 1/2000 | Azegami et al. |
| 6,140,836 A | 10/2000 | Fujii et al. |
| 6,163,168 A | 12/2000 | Nguyen et al. |
| 6,346,824 B1 | 2/2002 | New |
| 6,348,813 B1 | 2/2002 | Agrawal et al. |
| 6,396,303 B1 | 5/2002 | Young |
| 6,404,224 B1 | 6/2002 | Azegami et al. |
| 6,441,642 B1 | 8/2002 | Jones et al. |
| 6,466,051 B1 | 10/2002 | Jones et al. |
| 6,469,540 B2 | 10/2002 | Nakaya |
| 6,545,505 B1 | 4/2003 | Chan et al. |
| 6,593,771 B2 | 7/2003 | Bailis et al. |
| 6,611,153 B1 | 8/2003 | Lien et al. |
| 6,674,303 B1 | 1/2004 | Morse et al. |
| 6,686,769 B1 | 2/2004 | Nguyen et al. |
| 6,703,861 B2 | 3/2004 | Ting |
| 6,720,813 B1 | 4/2004 | Yee et al. |
| 6,731,133 B1 | 5/2004 | Feng et al. |
| 6,732,068 B2 | 5/2004 | Sample et al. |
| 6,798,240 B1 | 9/2004 | Pedersen |
| 6,806,730 B2 | 10/2004 | Bailis et al. |
| 6,810,513 B1 | 10/2004 | Vest |
| 6,829,756 B1 | 12/2004 | Trimberger |
| 6,992,505 B1 | 1/2006 | Zhou |
| 6,998,872 B1 | 2/2006 | Chirania et al. |
| 7,010,667 B2 | 3/2006 | Vorbach et al. |
| 7,028,281 B1 | 4/2006 | Agrawal et al. |
| 7,030,651 B2 | 4/2006 | Madurawe |
| 7,061,941 B1 | 6/2006 | Zheng |
| 7,075,333 B1 | 7/2006 | Chaudhary et al. |
| 7,084,666 B2 | 8/2006 | Madurawe |
| 7,088,134 B1 | 8/2006 | Agrawal et al. |
| 7,088,136 B1 | 8/2006 | Lewis |
| 7,138,827 B1 | 11/2006 | Trimberger |
| 7,149,996 B1 | 12/2006 | Lysaght et al. |
| 7,154,299 B2 | 12/2006 | Swami et al. |
| 7,245,150 B2 | 7/2007 | Goel et al. |
| 7,274,235 B2 | 9/2007 | Nicolaidis |
| 7,342,415 B2 | 3/2008 | Teig et al. |
| 7,372,297 B1 | 5/2008 | Pugh et al. |
| 7,489,162 B1 * | 2/2009 | Schmit et al. ................ 326/38 |
| 7,514,957 B2 | 4/2009 | Schmit et al. |
| 7,679,401 B1 | 3/2010 | Redgrave |
| 7,746,111 B1 | 6/2010 | Gaide et al. |
| 7,898,291 B2 * | 3/2011 | Rohe et al. ................. 326/38 |
| 7,928,761 B2 | 4/2011 | Voogel et al. |
| 8,089,300 B2 | 1/2012 | Redgrave |
| 8,674,721 B2 | 3/2014 | Redgrave et al. |
| 8,674,723 B2 | 3/2014 | Redgrave |
| 2001/0007428 A1 | 7/2001 | Young et al. |
| 2002/0008541 A1 | 1/2002 | Young et al. |
| 2002/0089349 A1 | 7/2002 | Barbier et al. |
| 2002/0113619 A1 | 8/2002 | Wong |
| 2002/0125910 A1 | 9/2002 | New et al. |
| 2002/0125914 A1 | 9/2002 | Kim |
| 2002/0163357 A1 | 11/2002 | Ting |
| 2003/0001613 A1 | 1/2003 | Nakaya |
| 2003/0042931 A1 | 3/2003 | Ting |
| 2004/0008055 A1 | 1/2004 | Khanna et al. |
| 2004/0010767 A1 | 1/2004 | Agrawal et al. |
| 2004/0041610 A1 | 3/2004 | Kundu |
| 2004/0098630 A1 | 5/2004 | Masleid |
| 2004/0124881 A1 | 7/2004 | Thadikaran et al. |
| 2004/0178818 A1 | 9/2004 | Crotty et al. |
| 2004/0196066 A1 | 10/2004 | Ting |
| 2004/0222817 A1 | 11/2004 | Madurawe |
| 2004/0225980 A1 | 11/2004 | Cappelli et al. |
| 2005/0231235 A1 | 10/2005 | Crotty et al. |
| 2006/0164119 A1 | 7/2006 | Nowak-Leijten |
| 2006/0176075 A1 | 8/2006 | Or-Bach |
| 2006/0186920 A1 | 8/2006 | Feng et al. |
| 2006/0220678 A1 | 10/2006 | Rozas et al. |
| 2006/0220716 A1 | 10/2006 | Nicolaidis |
| 2007/0143577 A1 | 6/2007 | Smith |
| 2010/0122105 A1 | 5/2010 | Arslan et al. |
| 2012/0124541 A1 | 5/2012 | Amundson et al. |
| 2012/0139580 A1 * | 6/2012 | Redgrave ...................... 326/40 |
| 2013/0093462 A1 | 4/2013 | Teig et al. |

OTHER PUBLICATIONS

Portions of prosecution history of U.S. Appl. No. 12/702,290, Aug. 23, 2011, Redgrave, Jason.

Portions of prosecution history of U.S. Appl. No. 13/311,531, Jan. 31, 2014, Redgrave, Jason.

Author Unknown, "§3 Programmable Logic Devices," Digital System Design, 2001 Month N/A, slides 3.1-3.28.

Boyer, F-R., et al., "Minimizing Sensitivity to Clock Skew Variations Using Level Sensitive Latches," Month Unknown, 2001, 4 pages.

Compton, K., et al., "Reconfigurable Computing: A Survey of Systems and Software," ACM Computing Surveys, Jun. 2002, pp. 171-210, vol. 34, No. 2, ACM, New York, NY.

Keutzer, K., "Overview of *configurable* architectures," Feb. 28, 2002, slides 1-29.

Kudlugi, et al., "Static Scheduling of Multidomain Circuits for Fast Functional Verification", IEEE Transactions on Computer-Aided Design of Integrated Circuits and Systems, vol. 21, No. 11, Nov. 2002, pp. 1253-1268.

Leiserson, C., et al., "Retiming Synchronous Circuitry," Digital Systems Research Center; Aug. 20, 1986, pp. 1-42, Palo Alto, CA.

Ochotta, E.S., et al., "A Novel Predictable Segmented FPGA Routing Architecture," FPGA 98, Feb. 1998, pp. 3-11, ACM, Monterey, CA, USA.

Pedram, M., "IEEE Circuits and Systems Society Distinguished Lecturer Program," 2003-2004 Month N/A, 28 pages.

Rahman, A., et al., "Wiring Requirement and Three-Dimensional Integration Technology for Field Programmable Gate Arrays," IEEE Transactions on Very Large Scale Integration (VLSI) Systems, Feb. 2003, pp. 44-54, vol. 11, No. 1, IEEE.

Schmit, H., "Incremental Reconfiguration for Pipelined Applications," Proceedings of the 5$^{th}$ IEEE Symposium on FPGA-Based Custom Computing Machined, Apr. 16-18, 1997, 9 pages.

Schmit, H., et al., "FPGA Switch Block Layout and Evaluation," FPGA '02, Feb. 24-26, 2002, 8 pages, ACM, Monterey, California, USA.

Schmit, H., et al., "PipeRench: A Virtualized Programmable Datapath in 0.18 Micron Technology," Proceedings of the IEEE 2002 Custom Integrated Circuits Conference, May 12-15, 2002, pp. 63-66.

Teifel, J., et al., "Highly Pipelined Asynchronous FPGAs," Proceedings of the 2004 ACM/SIGDA 12$^{th}$ International Symposium on Field Programmable Gate Arrays, Feb. 22-24, 2004, Monterey, California, USA.

* cited by examiner

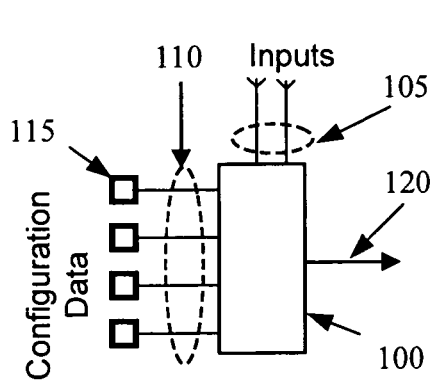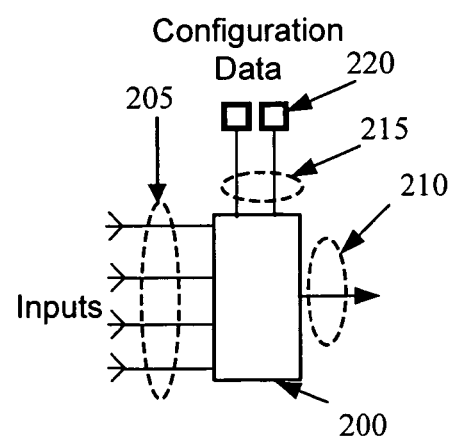
**Figure 1
Prior Art**
**Figure 2
Prior Art**

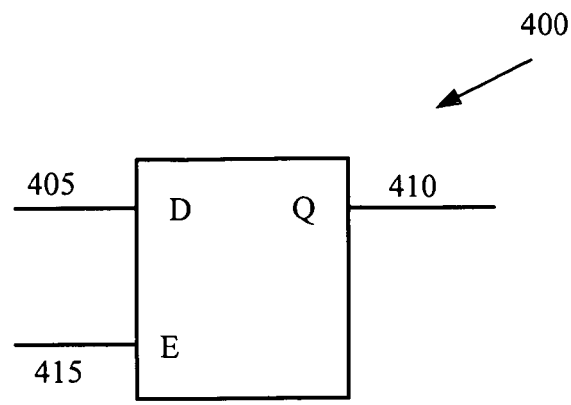
Figure 4
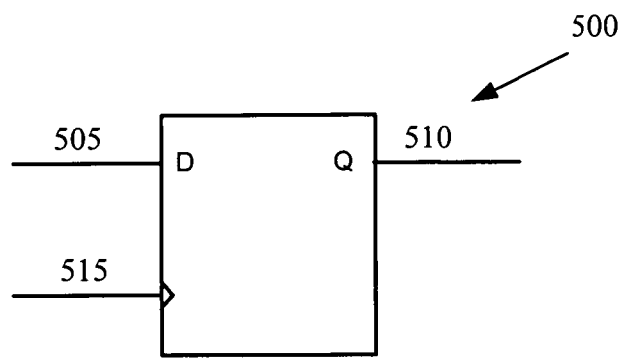
Figure 5
| D(t) | Q(t) | Q(t+1) |
|------|------|--------|
| 0 | X | 0 |
| 1 | X | 1 |
Figure 6

Double-edge triggered register

Timing diagram of the double-edge triggered register

Design element mapping during synthesis

USER REGISTERS IMPLEMENTED WITH ROUTING CIRCUITS IN A CONFIGURABLE IC

CLAIM OF BENEFIT TO PRIOR APPLICATIONS

This application is a continuation application of U.S. patent application 13/311,531, filed Dec. 5, 2011, now published as U.S. Publication 2012/0139580. U.S. patent application Ser. No. 13/311,531 is a continuation application of U.S. patent application Ser. No. 12/702,290, filed on Feb. 8, 2010, now issued as U.S. Pat. No. 8,089,300. U.S. patent application Ser. No. 12/702,290 is a continuation application of U.S. patent application Ser. No. 11/292,952, filed on Dec. 1, 2005, now issued as U.S. Pat. No. 7,679,401. U.S. patent application Ser. No. 13/311,531, now published U.S. Publication 2012/0139580, and U.S. Pat. Nos. 8,089,300 and 7,679,401 are incorporated herein by reference.

FIELD OF THE INVENTION

The present invention is directed towards configurable IC with interconnect circuits that also perform storage operations.

BACKGROUND OF THE INVENTION

The use of configurable integrated circuits ("IC's") has dramatically increased in recent years. One example of a configurable IC is a field programmable gate array ("FPGA"). An FPGA is a field programmable IC that often has logic circuits, interconnect circuits, and input/output (I/O) circuits. The logic circuits (also called logic blocks) are typically arranged as an internal array of circuits. These logic circuits are typically connected together through numerous interconnect circuits (also called interconnects). The logic and interconnect circuits are often surrounded by the I/O circuits. Like some other configurable IC's, the logic circuits and interconnect circuits of an FPGA are configurable.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set is stored in a set of SRAM cells 115. From the set of functions that the logic circuit 100 can perform, the configuration data set specifies a particular function that this circuit has to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Multiplexers and look-up tables are two examples of configurable logic circuits.

FIG. 2 illustrates an example of a configurable interconnect circuit 200. This interconnect circuit 200 connects a set of input data 205 to a set of output data 210. This circuit receives configuration data bits 215 that are stored in a set of SRAM cells 220. The configuration bits specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

FIG. 3A conceptually illustrates a simplified portion of a prior art configurable IC 300 island style architecture. As shown in this figure, the IC 300 includes an array of configurable logic circuits 305 and configurable interconnect circuits 310. The IC 300 has two types of interconnect circuits 310a and 310b. Interconnect circuits 310a connect interconnect circuits 310b and logic circuits 305, while interconnect circuits 310b connect interconnect circuits 310a to other interconnect circuits 310a.

In some cases, the IC 300 includes numerous logic circuits 305 and interconnect circuits 310 (e.g., hundreds, thousands, hundreds of thousands, etc. of such circuits). Each logic circuit 305 includes additional logic and interconnect circuits. Specifically, FIG. 3A illustrates a logic circuit 305a. As illustrated in FIG. 3B in more detail, this logic circuit includes two sections 315a that together are called a slice. Each section includes a look-up table (LUT) 320, a user register 325, a multiplexer 330, and possibly other circuitry (e.g., carry logic) not illustrated in FIG. 3B.

As shown in FIG. 3B, the multiplexer 330 is responsible for selecting between the output of the LUT 320 or the user register 325. For instance, when the logic circuit 305a has to perform a computation through the LUT 320, the multiplexer 330 selects the output of the LUT 320. Alternatively, this multiplexer selects the output of the user register 325 when the logic circuit 305a or a slice of this circuit needs to store data for a future computation of the logic circuit 305a or another logic circuit.

FIG. 3C illustrates an alternative way of constructing half a slice in a logic circuit 305a of FIG. 3A. Like the half-slice 315a in FIG. 3B, the half-slice 315b in FIG. 3C includes a look-up table (LUT) 320, a user register 325, a multiplexer 330, and possibly other circuitry (e.g., carry logic) not illustrated in FIG. 3C. However, in the half-slice 315b, the user register 325 can also be configured as a latch. In addition, the half-slice 315b also includes a multiplexer 350. In half-slice 315b, the multiplexer 350 receives the output of the LUT 320 instead of the register/latch 325, which receives this output in half-slice 315a. The multiplexer 350 also receives a signal from outside of the half-slice 315b. Based on its select signal, the multiplexer 350 then supplies one of the two signals that it receives to the register/latch 325. In this manner, the register/latch 325 can be used to store (1) the output signal of the LUT 320 or (2) a signal from outside the half-slice 315b.

At times, the use of user registers to store such data is suboptimal, as it typically requires data to be passed at a clock's rising edge or a clock's falling edge. In other words, registers often do not provide flexible control over the data passing between the various circuits of the configurable IC. In addition, the placement of a register or a latch in the logic circuit increases the signal delay through the logic circuit, as it requires the use of at least one multiplexer 330 to select between the output of a register/latch 325 and the output of a LUT 320.

Accordingly, there is a need for a configurable IC that has a more flexible approach for storing data and passing the data. More generally, there is a need for more flexible storage mechanisms in configurable IC's.

SUMMARY OF THE INVENTION

Some embodiments of the invention provide a configurable integrated circuit ("IC"). The configurable IC includes a set of configurable logic circuits for configurably performing a set of functions. The configurable IC also includes a set of configurable routing circuits for routing signals to and from the configurable circuits. During several operational cycles of the configurable IC, a set of data registers are defined by the configurable routing circuits. These data registers may be used wherever a flip-flop can be used.

Some embodiments provide a reconfigurable IC. This reconfigurable IC includes a set of reconfigurable circuits for reconfigurably performing a set of operations in more than one reconfiguration cycle. The reconfigurable IC also includes a set of reconfigurable circuits that perform a storage operation during one reconfiguration cycle and perform a non-storage operation during a second reconfiguration cycle. At least two of these reconfigurable circuits are communicatively coupled to operate as a data register during at least two reconfiguration cycles.

Some embodiments provide a method of designing a configurable IC. The method includes receiving a first design that has at least one controllable circuit that is initialized by a first type of initialization signal. This first design also has at least one controllable circuit that is initialized by a second type of initialization signal. The method defines a second design based on the first design. The method defines this second design by replacing all controllable circuits that are initialized by the first type of initialization signal with functionally equivalent controllable circuits. Each of these functionally equivalent controllable circuits includes a particular controllable circuit that is initialized by the second type initialization signal.

BRIEF DESCRIPTION OF THE DRAWINGS

The novel features of the invention are set forth in the appended claims. However, for purpose of explanation, several embodiments of the invention are set forth in the following figures.

FIG. 1 illustrates an example of a prior art configurable logic circuit.

FIG. 2 illustrates an example of a prior art configurable interconnect circuit.

FIG. 4 illustrates an example of a D-latch.

FIG. 5 illustrates an example of a register, which is a D flip-flop.

FIG. 6 illustrates the truth table of the flip-flop shown in FIG. 5.

DETAILED DESCRIPTION OF THE INVENTION

Figure 3A:
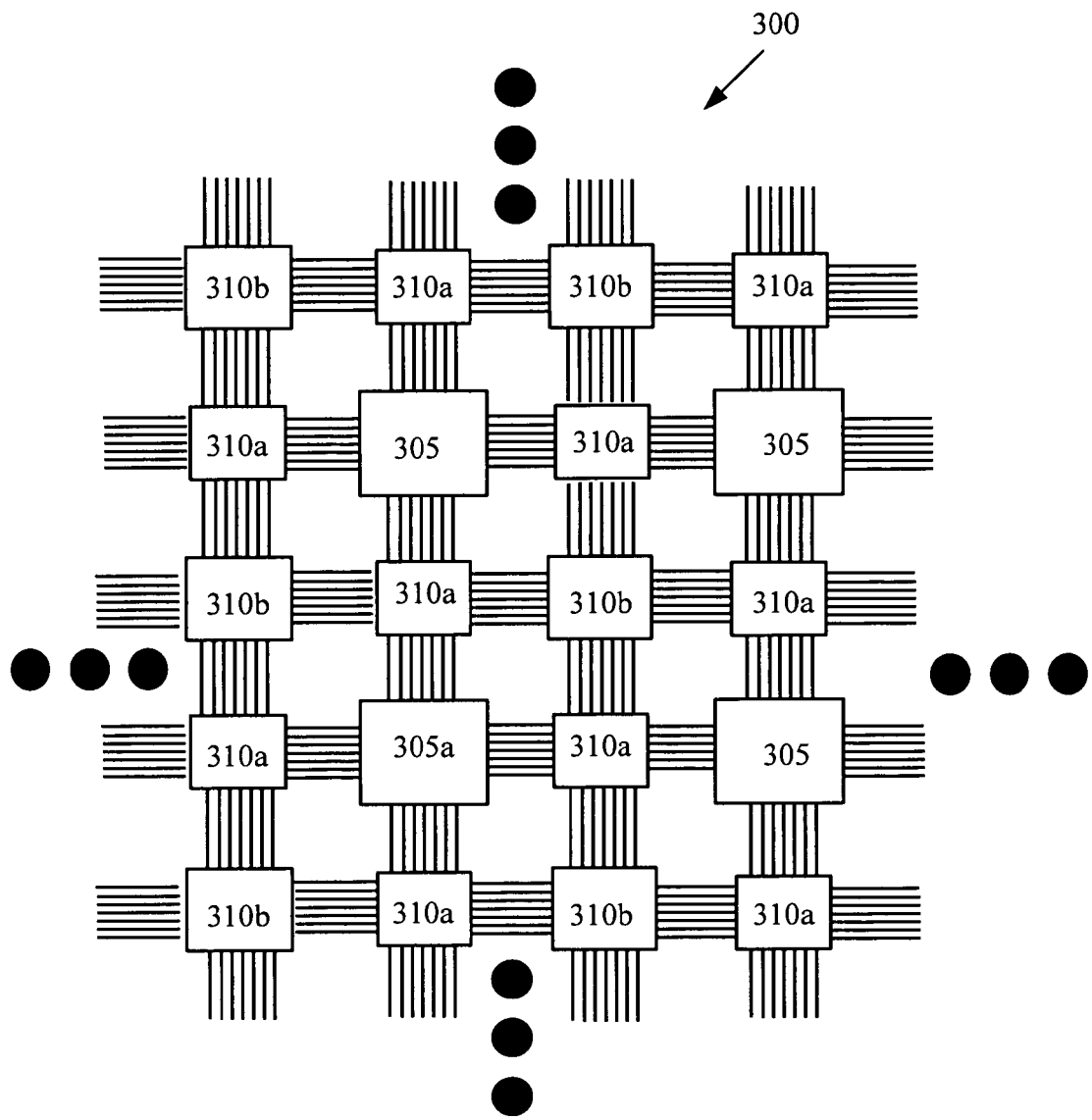
FIG. 3A illustrates a portion of a prior art configurable IC.
Figure 3B:
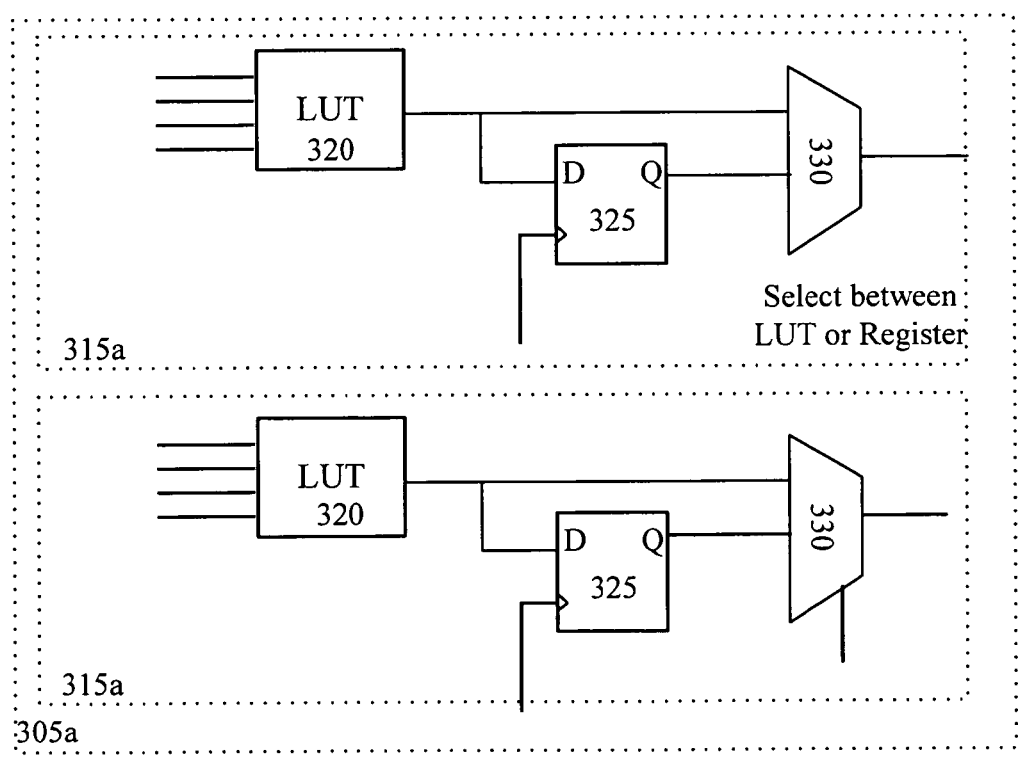
FIG. 3B illustrates a prior art logic circuit.
Figure 3C:
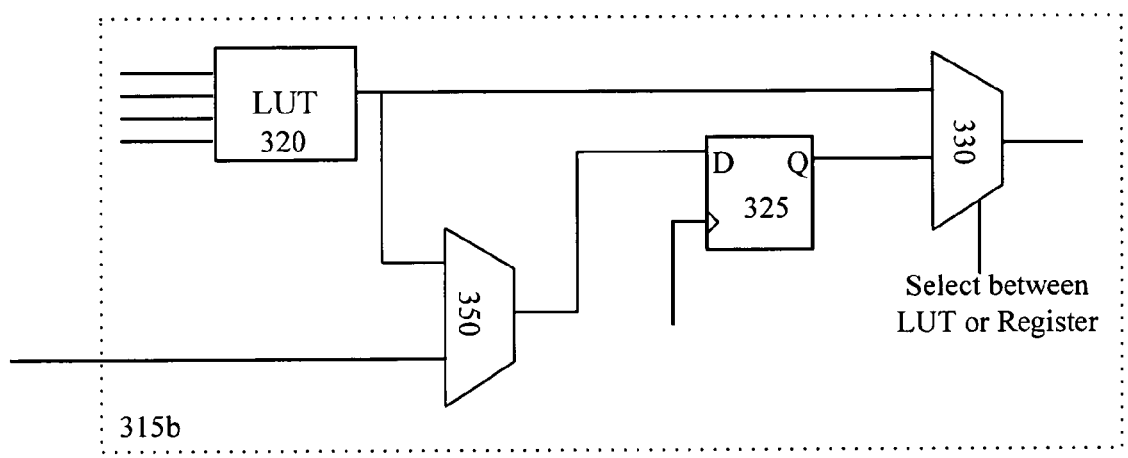
FIG. 3C illustrates an alternative way of constructing the logic circuit of FIG. 3B.

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

Some embodiments of the invention provide a configurable integrated circuit ("IC"). The configurable IC includes a set of configurable logic circuits for configurably performing a set of functions. The configurable IC also includes a set of configurable routing circuits for routing signals to and from the configurable circuits. During several operational cycles of the configurable IC, a set of data registers are defined by the configurable routing circuits. These data registers may be used wherever a flip-flop can be used.

Some embodiments provide a reconfigurable IC. This reconfigurable IC includes a set of reconfigurable circuits for reconfigurably performing a set of operations in more than one reconfiguration cycle. The reconfigurable IC also includes a set of reconfigurable circuits that perform a storage operation during one reconfiguration cycle and perform a non-storage operation during a second reconfiguration cycle. At least two of these reconfigurable circuits are communicatively coupled to operate as a data register during at least two reconfiguration cycles.

Some embodiments provide a method of designing a configurable IC. The method includes receiving a first design that has at least one controllable circuit that is initialized by a first type of initialization signal. This first design also has at least one controllable circuit that is initialized by a second type of initialization signal. The method defines a second design based on the first design. The method defines this second design by replacing all controllable circuits that are initialized by the first type of initialization signal with functionally equivalent controllable circuits. Each of these functionally equivalent controllable circuits includes a particular controllable circuit that is initialized by the second type of initialization signal.

Several more detailed embodiments of the invention are described in sections below. Before describing these embodiments further, an overview of latches and user registers are given in Section II below. This discussion is followed by the discussion in Section III of the configurable IC architecture that is used by some embodiments to implement user registers using interconnect/storage circuits. Next, Section IV describes implementation of user registers in a reconfigurable IC. Next, Section V presents several examples of different uses of user registers. Section VI describes replacing each set (or reset) user register with its functionally equivalent reset (or set) registers. Last, Section VII describes an electronics system that has an IC which implements some of the embodiments of the invention.

I. Terms and Concepts

A. Latches

A latch is one type of a storage element. FIG. 4 illustrates an example of a D-latch 400. As shown in this figure, the latch 400 has an input terminal 405, an output terminal 410, and an enable terminal 415. Based on the signal on the enable terminal 415, the latch either holds its output constant (i.e., is closed) or passes its input to its output (i.e., is open). For instance, the latch 400 (1) might pass the signal on its input terminal 405 to its output terminal 410 when the enable signal is not active (e.g., when the signal on the enable terminal 415 is low), and (2) might store a value and hold its output constant at this value when the enable signal is active (e.g., when the signal is high). Such a latch typically stores the value that it was receiving when the enable signal transitions from its inactive state (e.g., low) to its active state (e.g., high).

B. Registers

A register (also referred to as user register or data register) is a circuit that receives an input data, holds the data for a period of time, and posts the data at its output for a period of time. A user register operates synchronously with a clock. To do this, a register might receive a clock signal. However, this is not an absolute condition. In fact, several registers described below are controlled by enable signaling that are set to cause the registers operation to be synchronous with a clock signal. The enable signals can be driven from different sources. For instance, the enable signal may be generated by circuit logic, driven directly or indirectly by the clock, or may be taken from configuration values stored in a set of storage elements (e.g., SRAM cells).

FIG. 5 illustrates an example of a register 500, which is a D flip-flop. As shown in this figure, the register 500 includes an input terminal 505, an output terminal 510, and a terminal 515 to strobe the register. As described above, this strobing can be done with a clock signal or by an enable signal that causes the register to operate synchronously with a clock signal. Based on the signal on this terminal 515, the register either holds its output constant or passes its input to its output. For instance, when the signal makes a transition (e.g., goes from low to high), the register 500 samples its input. Next, when the signal is constant or makes the other transition, the register 500 provides at its output 510 the value that it most recently sampled at its input. In a register, the input data typically must be present and held constant a particular time interval before and after the active strobe transition. FIG. 6 illustrates the truth table of register 500. As illustrated in FIG. 6, regardless of the current value of the output (value of Q at time t), the value of the output after the next strobe signal transition (value of Q at time t+1) assumes the current value of the input (value of D at time t). This flip-flop can be interpreted as a primitive delay line, since the data is conveyed to the output one strobe cycle after it arrives at the input.

Figure 7:
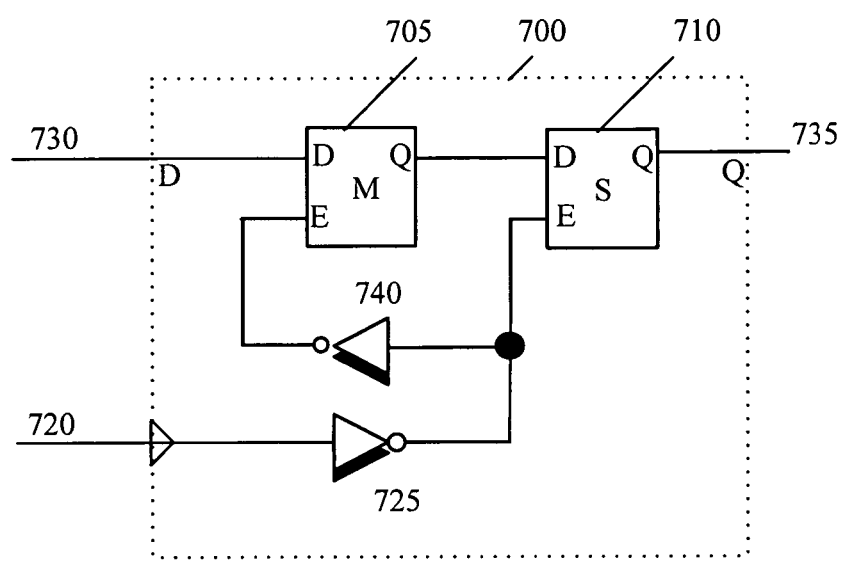
FIG. 7 illustrates a prior art implementation of a register with a pair of latches.

FIG. 7 illustrates a prior art implementation of a register 700 with a pair of latches 705 and 710. In this arrangement, the first latch 705 is referred to as the master latch, while the second latch 710 is referred to as the slave latch. The master and slave receive a clock signal 720 as their enable signals, but they receive the clock signal at opposite polarities because of the inverter 740.

Assuming that the latches 705 and 710 are enable-high latches, the register 700 operates as follows. Initially, when the clock signal 720 is low, the master latch 705 is open, while the slave latch 710 is closed. When the clock signal 720 then goes high, the slave latch 710 opens and the master latch 705 closes. This, in turn, causes the slave latch 710 to output the signal that was appearing at the input line 730 of the master latch right before the master latch closed. Next, when the clock signal 720 transitions low, the slave latch 710 closes before the master latch 705 opens. This causes the slave latch 710 to hold the value that it was outputting before the clock transitioned low, during the period that the clock remains low. This value (that is being held by the slave latch 710) is the value that the master latch 705 was receiving before the prior low-to-high transition of the clock signal 720.

C. Configurable IC's

A configurable IC is an IC that has configurable circuits. A configurable IC might include configurable computational circuits (e.g., configurable logic circuits) and configurable routing circuits for routing the signals to and from the configurable computation units. In addition to configurable circuits, a configurable IC also typically includes non-configurable circuits (e.g., non-configurable logic circuits, interconnect circuits, memories, etc.).

A configurable circuit is a circuit that can "configurably" perform a set of operations. Specifically, a configurable circuit receives "configuration data" that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of ways. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

Some embodiments provide reconfigurable ICs. Reconfigurable IC's are one type of configurable IC's. Reconfigurable IC's are configurable IC's that can reconfigure during runtime. In other words, a reconfigurable IC is an IC that has reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it receives a different set of configuration data. Some embodiments of the invention are implemented in reconfigurable IC's that are sub-cycle reconfigurable (i.e., can reconfigure circuits on a sub-cycle basis).

In some embodiments, runtime reconfigurability means reconfiguring without resetting the reconfigurable IC. Resetting a reconfigurable IC entails in some cases resetting the values stored in the state elements of the IC, where state elements are elements like latches, registers, and non-configuration memories (e.g., memories that store the user signals as opposed to the memories that store the configuration data of the configurable circuits). In some embodiments, runtime reconfigurability means reconfiguring after the reconfigurable IC has started processing of the user data. Also, in some embodiments, runtime reconfigurability means reconfiguring after the reconfigurable IC has powered up. These definitions of runtime reconfigurability are not mutually exclusive. Configurable and reconfigurable ICs are described in detail in U.S. patent application Ser. No. 11/081,859, "Configurable IC with Interconnect Circuits that also Perform Storage Operations", filed on Mar. 15, 2005, now issued as U.S. Pat. No. 7,342,415.

II. Architecture

Figure 8:
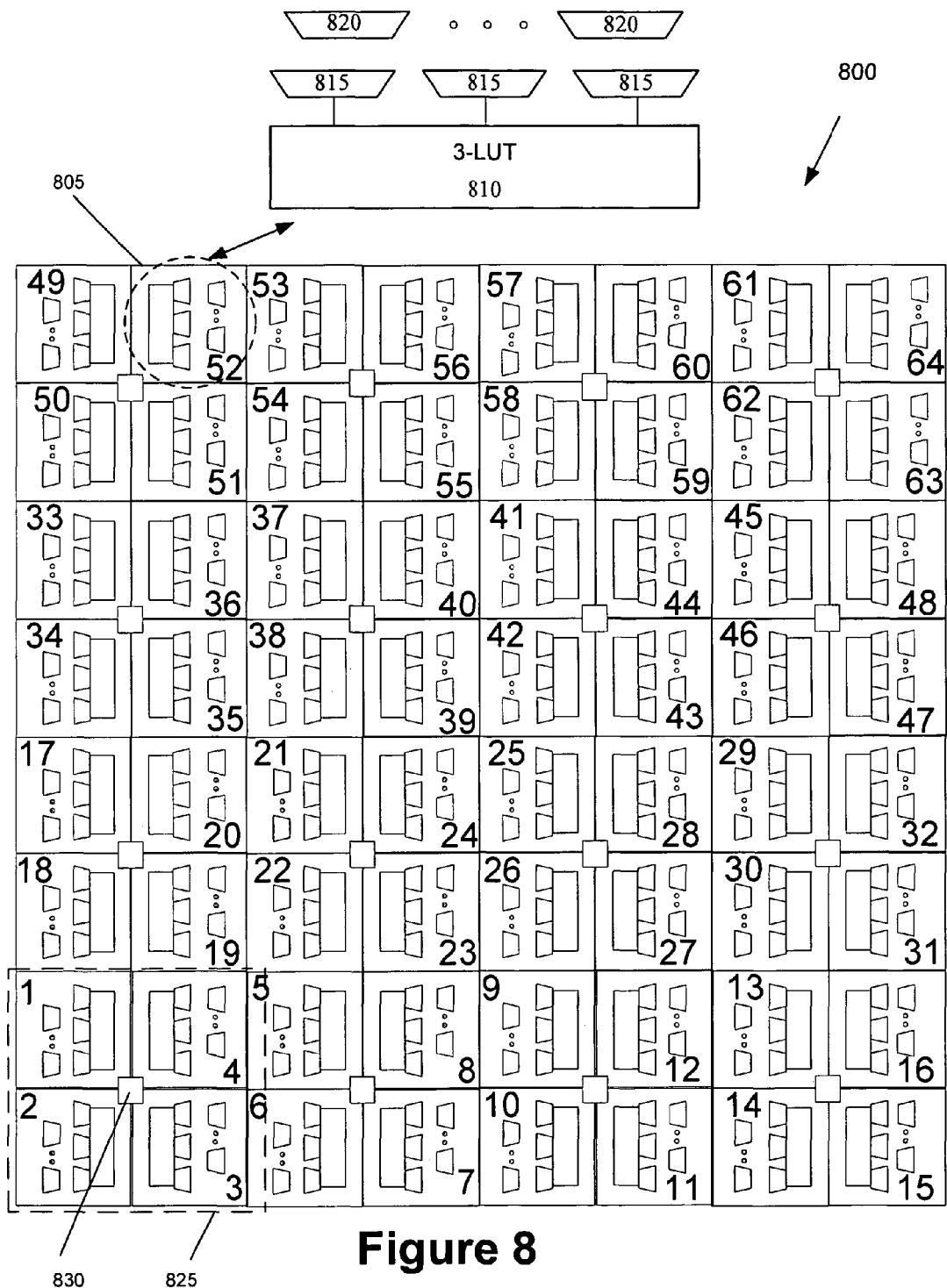
FIG. 8 conceptually illustrates a configurable IC of some embodiments.

FIG. 8 conceptually illustrates a portion of the configurable circuit architecture of some embodiments of the invention. As shown in FIG. 8, this architecture is formed by numerous configurable tiles 805 that are arranged in an array with multiple rows and columns. In FIG. 8, each configurable tile includes a configurable three-input logic circuit 810, three configurable input-select interconnect circuits 815, and several configurable routing interconnect circuits 820. Different embodiments have different number of configurable routing interconnect circuits 820. For instance, some embodiments may have eight configurable routing interconnect circuits while others may have more or less such circuits. For each configurable circuit, the configurable IC 800 includes a set of storage elements (e.g., a set of SRAM cells) for storing a set of configuration data.

In some embodiments, the logic circuits are look-up tables (LUTs) while the interconnect circuits are multiplexers. Also, in some embodiments, the LUTs and the multiplexers are sub-cycle reconfigurable circuits, as described in U.S. Patent Application "Configurable IC with Routing Circuits with Offset Connections", Ser. No. 11/082,193, filed on Mar. 15, 2005, now issued as U.S. Pat. No. 7,295,037. In some of these embodiments, the configurable IC stores multiple sets of configuration data for a sub-cycle reconfigurable circuit, so that the reconfigurable circuit can use different sets of configuration data in different sub-cycles. Other configurable tiles can include other types of circuits, such as memory arrays instead of logic circuits.

In FIG. 8, an input-select multiplexer (also referred to as an IMUX) 815 is an interconnect circuit associated with the LUT 810 that is in the same tile as the input select multiplexer. One such input select multiplexer receives input signals for its associated LUT and passes one of these input signals to its associated LUT. In some embodiments, some of the input-select multiplexers are hybrid input-select/logic circuits (referred to as HMUXs) capable of performing logic operations as well as functioning as input select multiplexers. For instance, in the embodiments described below, two of the three IMUXs are hybrid multiplexers called HUMUXs. An HUMUX (or HMUX for short) is a multiplexer that can receive "user-design signals" or configuration data. A user-design signal within a configurable IC is a signal that is generated by a circuit (e.g., logic circuit) of the configurable IC. The word "user" in the term "user-design signal" connotes that the signal is a signal that the configurable IC generates for a particular application that a particular user has configured the IC. User-design signal is abbreviated to user signal in some of the discussion below.

In FIG. 8, a routing multiplexer (also referred to as an RMUX) 820 is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provide its output to several logic and/or interconnect circuits (i.e., has a fan out greater than 1), or provides its output to other interconnect circuits. RMUXs are further described in Section III, below.

Even though the embodiments described below are described with reference to this specific architecture, one of ordinary skill in the art would realize that other embodiments might be implemented in configurable ICs with other architecture that utilize features of this architecture differently. For instance, some embodiments might use HMUXs differently (for example, they might not just use HMUXs as input select multiplexers but might use them as a part of routing multiplexers or other types of interconnects). Other embodiments might use other types of logic circuits other than LUTs and/or might use more complex LUTs such as 4-input or 5-input LUTs. Moreover, the interconnects in the other embodiments might be multiplexers of a different size. Yet, in some other embodiments, the interconnects might not be multiplexers but might be other types of interconnects.

III. User Registers Implemented with Storage Elements of Interconnect Circuits

Some embodiments are configurable ICs that have storage elements. In some of these embodiments, some or all of the storage elements are located at the interconnect circuits. The storage elements (a) might be located within the interconnect circuit, (b) might be placed at the output of the interconnect circuit, or (c) can be built in the output stage of the interconnect circuit. As described below, some embodiments build the storage elements at the output of the interconnect circuits.

In some embodiments, an RMUX is a complementary pass logic (CPL) implemented 8-to-1 multiplexer. In a CPL implementation of a circuit, a complementary pair of signals represents each logic signal. In other words, the circuit receives true and complement sets of input signals and provides true and complement sets of output signals. In some embodiments all RMUXs have latches built in their output stages. In other embodiments, only some of the RMUXs (e.g., the ones with the smallest number of inputs) have latches built in their output stages. To implement the latch function of an RMUX, the two (true and complement) outputs of the 8-to-1 multiplexer are cross coupled with two NMOS transistors that receive a latch enable signal at their gates. This implementation of an RMUX is further described in the above mentioned U.S. patent application Ser. No. 11/081,859, now issued as U.S. Pat. No. 7,342,415.

Having the storage elements at some or all of the interconnect circuits is highly advantageous. For instance, such interconnect/storage elements obviate the need to route data computed by a first logic circuit to a second logic circuit that stores the computed data before routing the data to a third logic circuit that will use the data. Instead, such computed data can be stored at an interconnect circuit that is at an optimal location along the routing path between the first and third logic circuits. In reconfigurable ICs, such flexibility in routing data is highly advantageous when such data needs to pass between logic circuits that operate in different sub-cycles.

In the architecture illustrated in FIG. 8, each tile includes one three-input LUT, three input select multiplexers, and several routing multiplexers. In addition, every four tiles 825 share a carry logic circuit 830. Other embodiments, however, might have a different number of LUTs in each tile, a different number of inputs for each LUT, a different number of input-select multiplexers, and/or a different number of routing multiplexers.

As described above, in some embodiments some or all of the interconnect circuits are routing multiplexers with latches. These routing multiplexers may be utilized to implement edge-triggered flip-flops. For instance, FIG. 9 conceptually illustrates an edge-triggered flip-flop (or user register) 900 implemented by connecting two routing multiplexers 905 and 910 in a master/slave configuration. The two routing multiplexers have to be programmed to close (i.e., to hold the output constant) and open (i.e., to pass the input to the output) in different cycles of the strobe signal 915. When the master multiplexer 905 is open, the input (D) of this multiplexer is transferred to its output. During the same cycle, the slave multiplexer 910 is closed and it holds its output (Q). In the next cycle, the master multiplexer is closed and the slave multiplexer is open which results in the original input (D) of the master multiplexer to appear in the output (Q) of the slave multiplexer.

Figure 9:
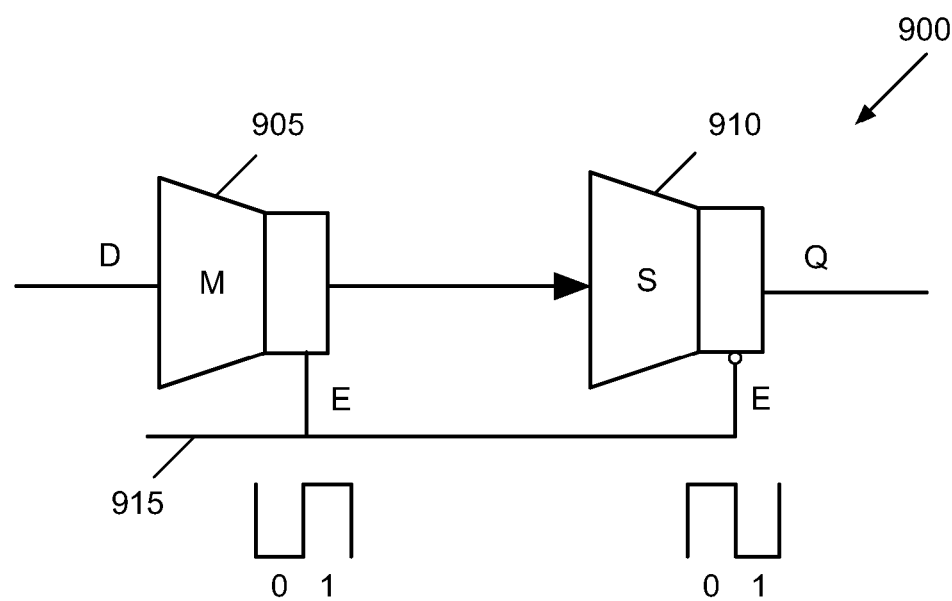
FIG. 9 conceptually illustrates a user register implemented by connecting two interconnect/storage elements in a master/slave configuration.

As illustrated in FIG. 9, the strobe input of one of the multiplexers is inverted to ensure that the two latches operate 180 degrees out of phase. As described above, the strobe (or enable) signals can be driven from different sources. For instance, the strobe signal may be generated by circuit logic, driven directly or indirectly by the clock, or may be taken from values stored in a set of storage elements.

In order to store data and pass data to each other, the two interconnect/storage elements shown in FIG. 9 do not need to be directly connected to each other. For instance, if the input (D) to the master multiplexer is only needed to perform intermediate operations and is not needed at the beginning of the next strobe cycle, the output of the master interconnect/storage element can be routed to other design elements for performing operations on the input data.

Figure 10:
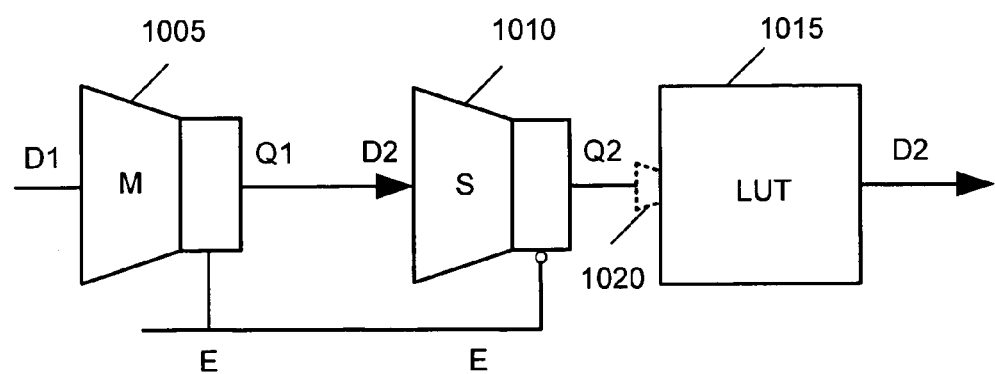
FIG. 10 illustrates a pair of master/slave interconnect/storage elements routing the output of the slave to a logic circuit.
Figure 11:
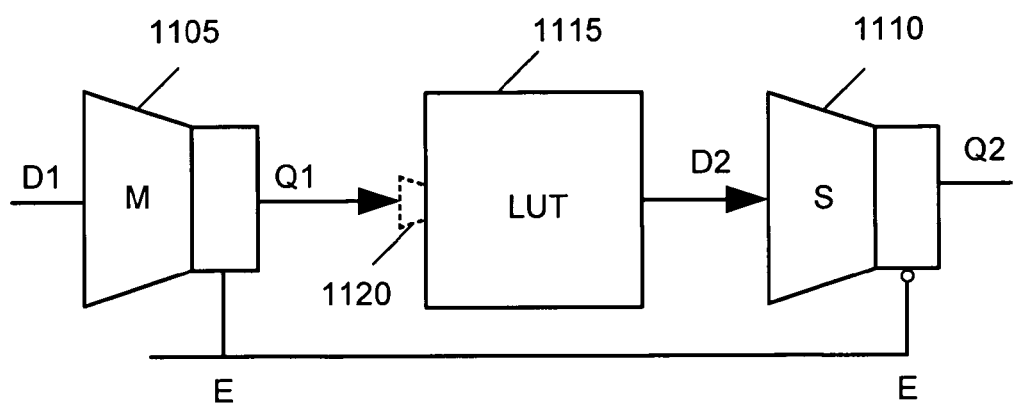
FIG. 11 illustrates a pair of master/slave interconnect/storage elements with a LUT receiving the output of the master.

FIGS. 10 and 11 illustrate one such example. Specifically, as shown in FIG. 10, a user register is configured from two interconnect/storage circuits 1005 and 1010. The output (Q2) of the user register is connected to a LUT 1015. The LUT 1015 uses this output to perform some operations. As described with reference to FIGS. 5 and 6 above, the value Q2 at the next strobe signal transition (value at time t+1) assumes the current value of the input (value of D1 at time t). Therefore, if the output (Q2) of the user register is not needed by any logic circuits other than LUT 1015, the LUT can be placed between the two master/slave interconnect/storage circuits 1005 and 1010. In this way, the LUT receives the value of D1 one strobe transition earlier, performs its operation, and sends the results of the operation to the slave interconnect/storage circuit 1010. FIG. 11 illustrates an example of such a configuration. As shown, a user register configured from the two interconnect/storage elements 1105 and 1110. The output of the master interconnect/storage element 1105 is connected to one of the input select multiplexers 1120 of a logic circuit (such as LUT 1115) and the output of the LUT is connected to the input of the slave interconnect/storage element 1110. As indicated above, the configuration illustrated in FIG. 11 is useful when the input value (D1) to the master 1105 is not needed at the beginning of the next strobe cycle and is only needed for performing operations by a design element such as LUT 1115. Logic circuit 1115 may also act as a pass-through. In this case, the input (D1) of the master multiplexer is transferred to the output (Q2) of the slave multiplexer without modification.

Figure 12:
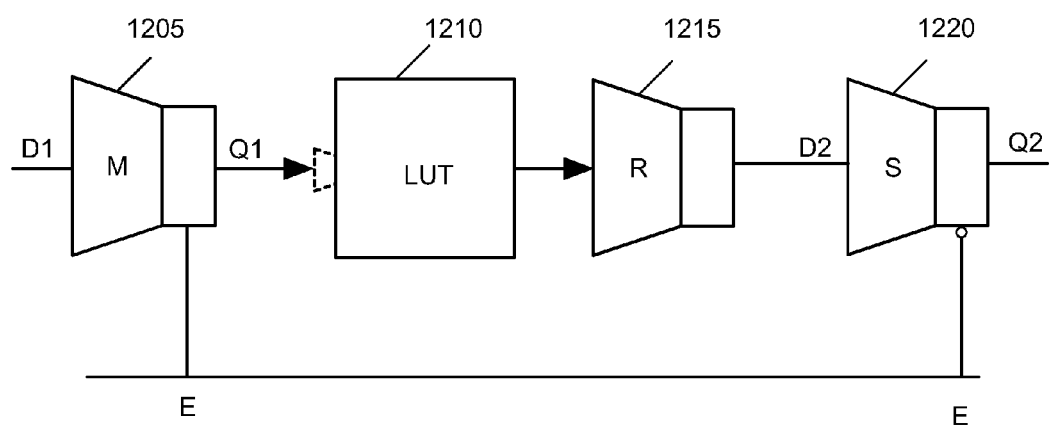
FIG. 12 illustrates a pair of master/slave interconnect/storage elements with a logic circuit and an RMUX between them.

Similarly, FIG. 12 illustrates two master/slave interconnect/storage 1205 and 1220 that are connected to each other by a logic circuit (such as LUT 1210) and an interconnect/storage element 1215. In this example, the interconnect/storage element 1215 is acting as an interconnect circuit (instead of storage) and LUT 1210 is a pass-through LUT. Although these examples are shown with only a few logic circuits and interconnect/storage elements between the master/slave latches, a person skilled in the art would recognize that more than one logic circuit and/or interconnect circuit as well as logic elements other than a LUT may be located between the master/slave latches and still provide the function of a flip-flop as well as routing data from one design element to the other using the interconnect/storage.

Figure 13:
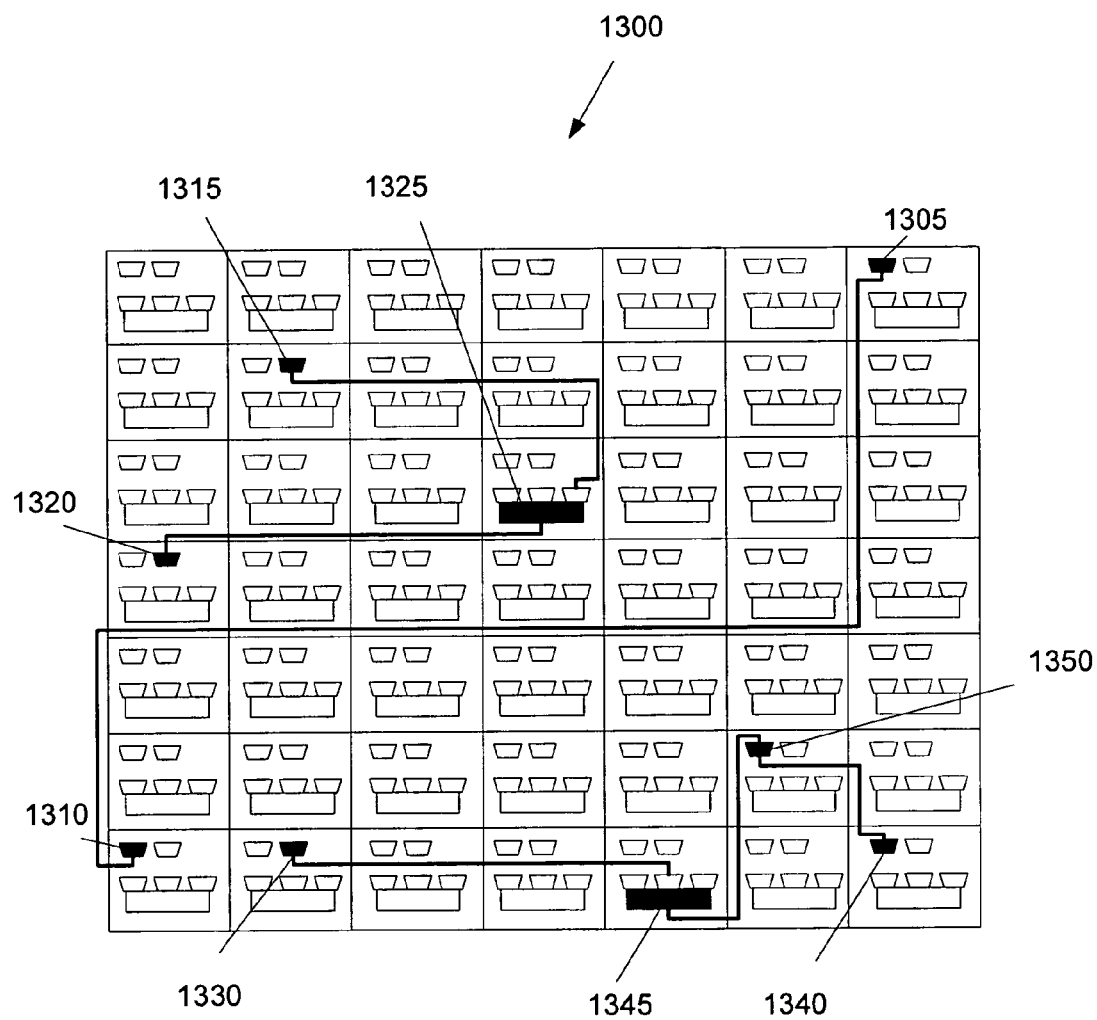
FIG. 13 conceptually illustrates an IC of some embodiments with several pairs RMUXs programmed to operate as master/slaves.

FIG. 13 conceptually illustrates an IC 1300 of some embodiments. In order not to obscure the subject of the invention with details, certain features such as shared carry logic and specific arrangements of tiles that some embodiments have are not shown in this figure. Several different user registers are formed in FIG. 13. The first user register is formed by connecting the output of RMUX 1305 to the input of RMUX 1310. This arrangement implements a user register similar to the user register 900 described above.

FIG. 13 also shows another user register implemented using RMUX 1315 as master and RMUX 1320 as slave. These two RMUX are, however, not directly connected together. As shown, the two RMUXs 1315 and 1320 are connected through LUT 1325. This arrangement is similar to the arrangement shown in FIG. 11. FIG. 13 also shows another user register that is formed by connecting RMUX 1330 (master) and RMUX 1340 (slave). As shown, the master 1330 and the slave 1340 RMUX are not connected directly together. Instead, the two RMUXs 1330 and 1340 are connected to each other through LUT 1345 and RMUX 1350. This arrangement implements a user register similar to previously described user register illustrated in FIG. 12.

As described above, some embodiments utilize RMUXs to implement user registers. There are several advantages to this approach. First, RMUXs are the interconnect circuitry and are available throughout the IC fabric, and therefore, the user registers are readily available anywhere. Second, the user register output is intrinsically part of the interconnect path; there are no extra outputs, and no extra multiplexers are needed to build the user registers. Third, no edge-triggered clock needs to be distributed. Fourth, extra features such as enable and clear are implemented only when needed. Several methods of implementing enable and clear for user registers are described below. Fifth, master/slave latches are easily implemented with the RMUXs. Sixth, the need for RMUXs and user registers can be exchanged. Seventh, setup and hold times are part of the interconnect delay.

IV. User Registers in a Reconfigurable IC

A. User Registers Operating on a Sub-Cycle Faster than the User Design Clock

Figure 14:
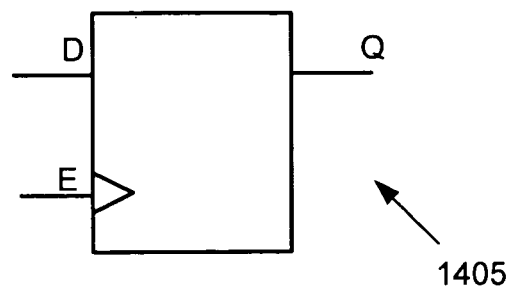
FIG. 14 conceptually illustrates an edge-triggered user register.

In some embodiments, a reconfigurable IC is configured in such a way that some user registers may operate on a sub-cycle that is different than the user design clock. As described below, the physical location of a user register may change from one sub-cycle to another without an impact to the user design. FIG. 14 conceptually illustrates a user register 1405. The input (D) of this register appears on the output (Q) at either the rising or the falling edge of the enable strobe.

As previously shown in FIG. 9, some embodiments implement user register 900 by a pair of master/slave RMUXs. The enable strobe to one of the RMUXs (RMUX 910 in this case) is inverted such that the two RMUXs work out of phase. The implementation shown in FIG. 9 is a "two loopered" implementation in which the master 905 and the slave 910 RMUXs are enabled in two different sub-cycles, each sub-cycle operating at a rate that is twice as fast as the user design clock.

Figure 15:
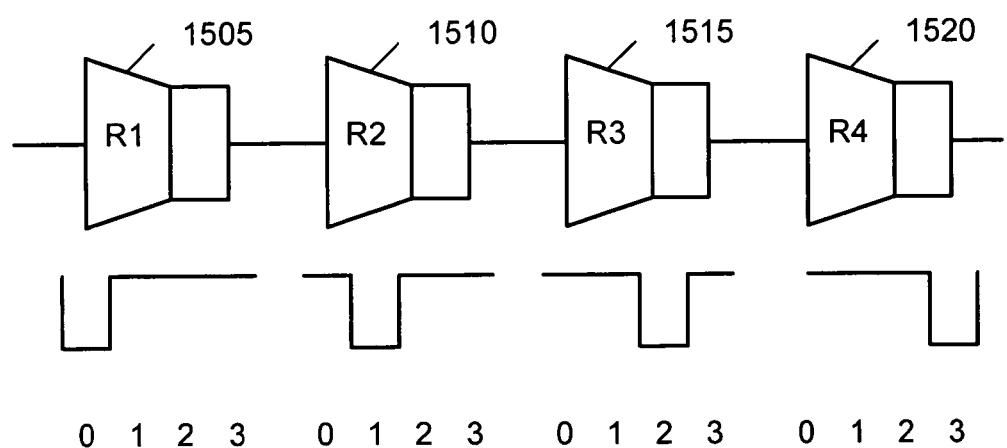
FIG. 15 illustrates an implementation of a user register using four RMUXs each operating on a different sub-cycle running four times faster than the user clock.

FIG. 15 illustrates an implementation of a user register using four RMUXs 1505-1520, each operating on a different sub-cycle running four times faster than the user clock. Utilizing four RMUXs, as shown in FIG. 15, is one way of implementing the user register 1405. The strobe lines are not shown for simplicity. Assuming that the user register has to hold its value during one user clock period, i.e., during four sub-cycles, and the register value is not needed during the intermediate sub-cycles, an alternative way of implementing the user register is to use only two RMUXs.

Figure 16:
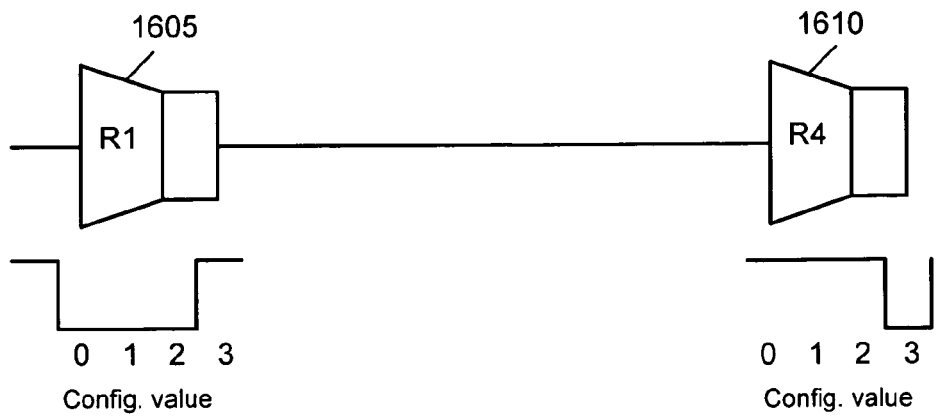
FIG. 16 illustrates a user register operating on four sub-cycle implemented using only two RMUXs.
Figure 17:
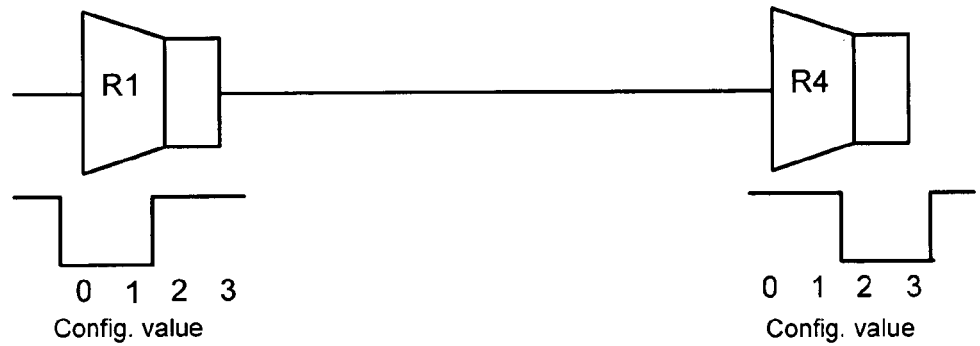
FIG. 17 is an alternative to FIG. 16.
Figure 18:
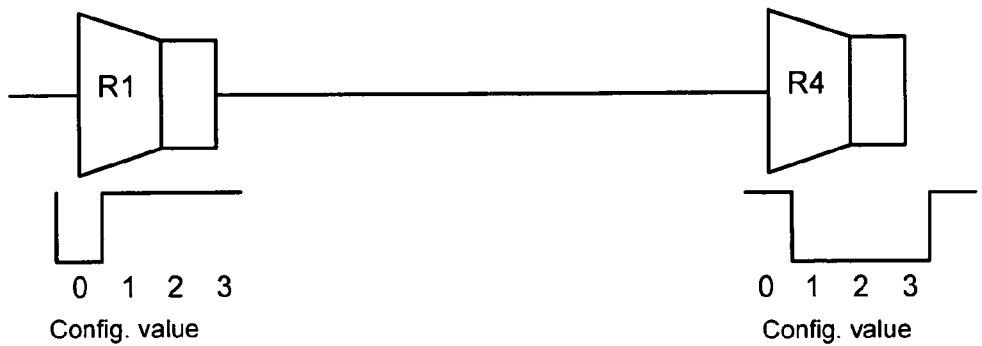
FIG. 18 is another alternative to FIG. 16.

FIG. 16 illustrates one such alternative way of implementing the user register. Specifically, a user register operating on four sub-cycles is implemented using only two RMUXs 1605 and 1610. Since the input of the master RMUX 1605 has to appear on the output of the slave RMUX 1610 before the next user clock, the deign can be programmed in a way that the master RMUX 1605 holds the input value for three sub-cycles and passes the value to the slave RMUX 1610 during the last sub-cycle as shown in FIG. 16. Alternately, the master RMUX can hold the input value for two sub-cycles and pass it to the slave RMUX to hold for the remaining two sub-cycles as illustrated in FIG. 17. Finally, the master RMUX can hold the input value for only one sub-cycle and pass it to the slave RMUX to hold for three sub-cycles, as illustrated in FIG. 18.

Figure 19:
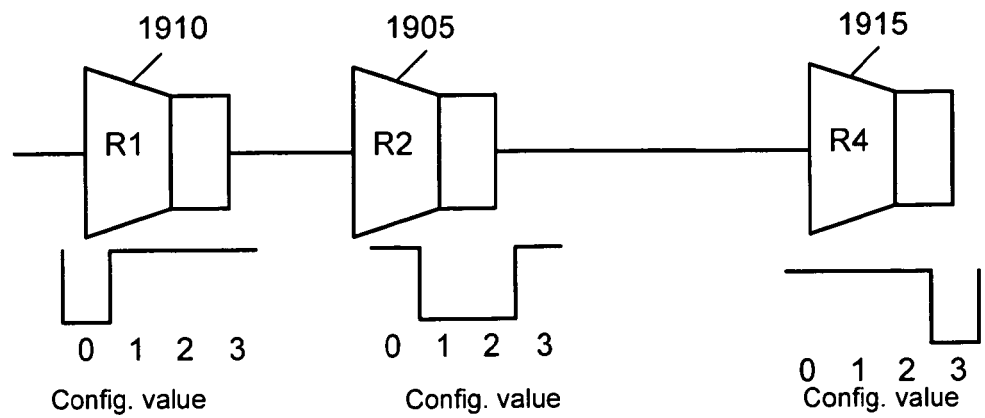
FIG. 19 illustrates a user register implemented with three RMUXs.
Figure 20:
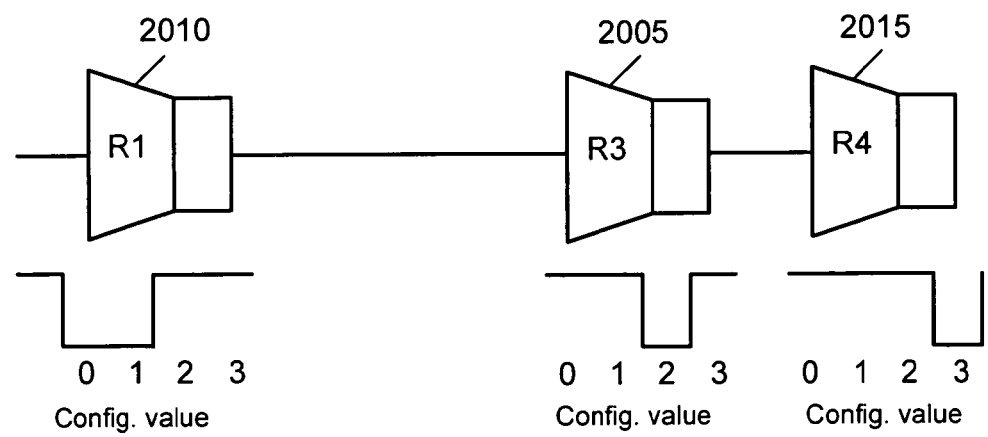
FIG. 20 is another alternative to FIG. 19.

A person of ordinary skills in the art would recognize that other arrangements of RMUXs to implement a user register are possible. For instance, in the example above where there are four sub-cycles per one user design clock cycle, a user register can be implemented using three RMUXs as illustrated in FIG. 19. As shown, RMUX 1905 is between RMUXs 1910 (master) and 1915 (slave). The user register may be configured in a way that the master RMUX 1910 holds the data for one sub-cycle and passes it to RMUX 1905 to hold the data for additional two sub-cycles before passing it to the slave RMUX 1915 in the fourth sub-cycle. Alternately, as shown in FIG. 20, the master RMUX 2010 may hold the data for two sub-cycles, RMUX 2005 for one sub-cycle, and slave RMUX 2015 for one sub-cycle.

B. User Registers Operating on a Sub-Cycle as Fast as the User Design Clock

One of the significant benefits of using RMUXs to implement user registers is that there is no need to distribute a distinct clock for edge-triggered devices. As a result, the effective update of a master/slave RMUX pair can happen only every other sub-cycle. This is not a problem when the sub-cycle clock runs faster than the user clock, but it presents a problem for portions of the design that run at a sub-cycle that is as fast as the user clock. In this latter case, in order to have state updated at the user clock rate, a state device that triggers on either the positive or the negative virtual edge is required. Some embodiments implement such a double-edge triggered user register using RMUXs.

Figure 21:
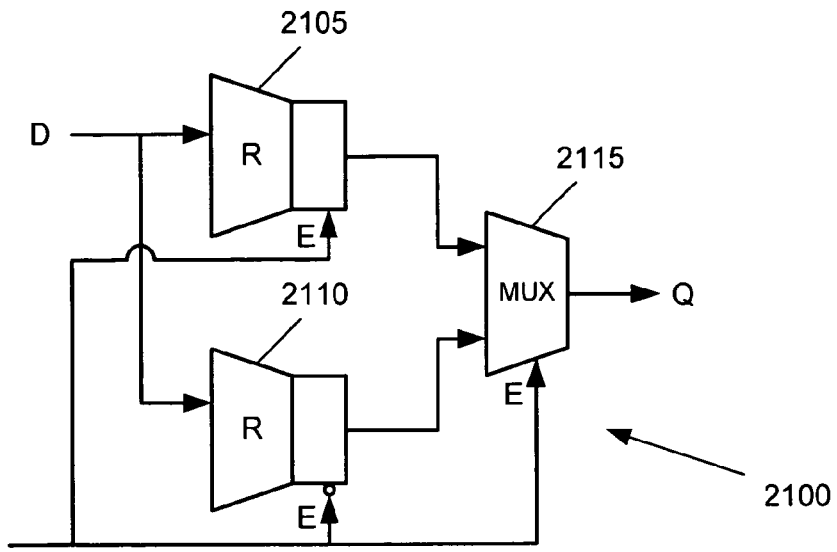
FIG. 21 illustrates a double-edge triggered user register of some embodiments.

FIG. 21 illustrates a double-edge triggered user register 2100. This register is implemented using two RMUXs 2105-2110 and a multiplexer 2115. Some embodiments implement multiplexer 2115 by using a routing multiplexer, while other embodiments implement multiplexer 2115 with any circuit (e.g., any logic or interconnect circuit) that can perform a multiplexer functionality. The two RMUXs 2105 and 2110 run at the same rate as the user clock. User register 2100 operates by employing two latches, one open on each sub-cycle. The output multiplexer 2115 is programmed to always select the closed latch. As a result, the output (Q) is always the value of the input (D) on the previous sub-cycle.

Figure 22:
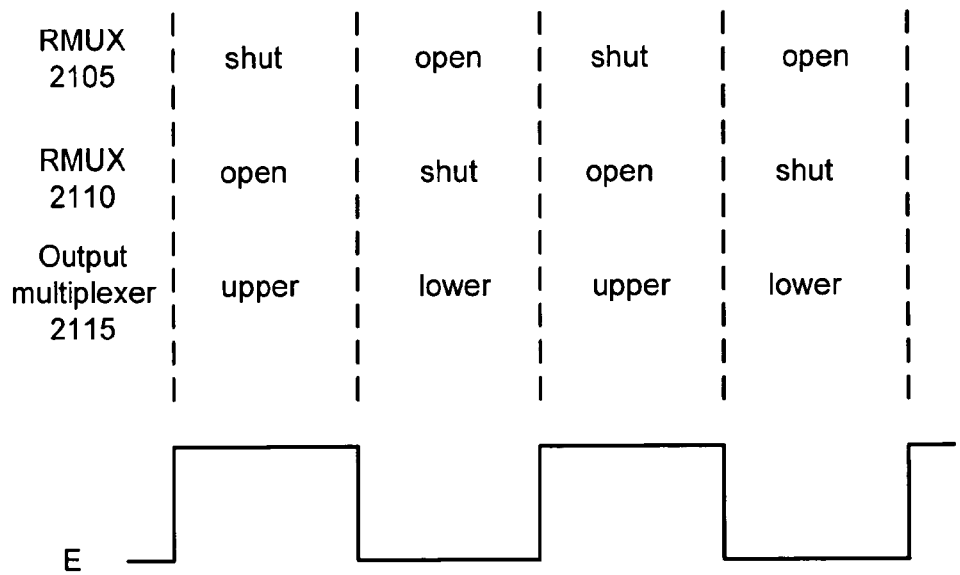
FIG. 22 illustrates a timing diagram of the user register of FIG. 21.

FIG. 22 illustrates a timing diagram of user register 2100. In the example of FIG. 22, the enable signal is also shown. As shown in the timing diagram, the output of the multiplexer 2115 is always the value of the input (D) of the previous sub-cycle.

C. User Registers Implemented with Logical RMUX Locations

As described above, an RMUX (such as 1605) may hold a value over several sub-cycles. In some embodiments, the location of such an RMUX in a reconfigurable IC may be a logical location. For instance, the reconfigurable IC may be programmed in such a way that instead of one RMUX acting as master RMUX to hold a value over three sub-cycles and then passing it to the slave RMUX in the fourth sub-cycle, the master RMUX may be a specific RMUX in a sub-cycle and another RMUX in the next sub-cycle. Specifically, the IC may be reconfigured in the next sub-cycle in such a way that the master RMUX is an RMUX for a different portion of the user design. The RMUX previously acting as master RMUX will be freed to do other unrelated operations.

The IC may be reconfigured several times to use different physical RMUXs as logical master RMUX before passing the value of the user register to the slave RMUX. The slave RMUX may be similarly programmed to be a specific physical RMUX during some sub-cycles and to be different physical RMUXs during other sub-cycles. In other words, while as far as the user design is concerned, the logical (or operational) site of a master (or slave) RMUX is the same during different sub-cycles, the physical site of the master (or slave) RMUX may change.

Figure 23:
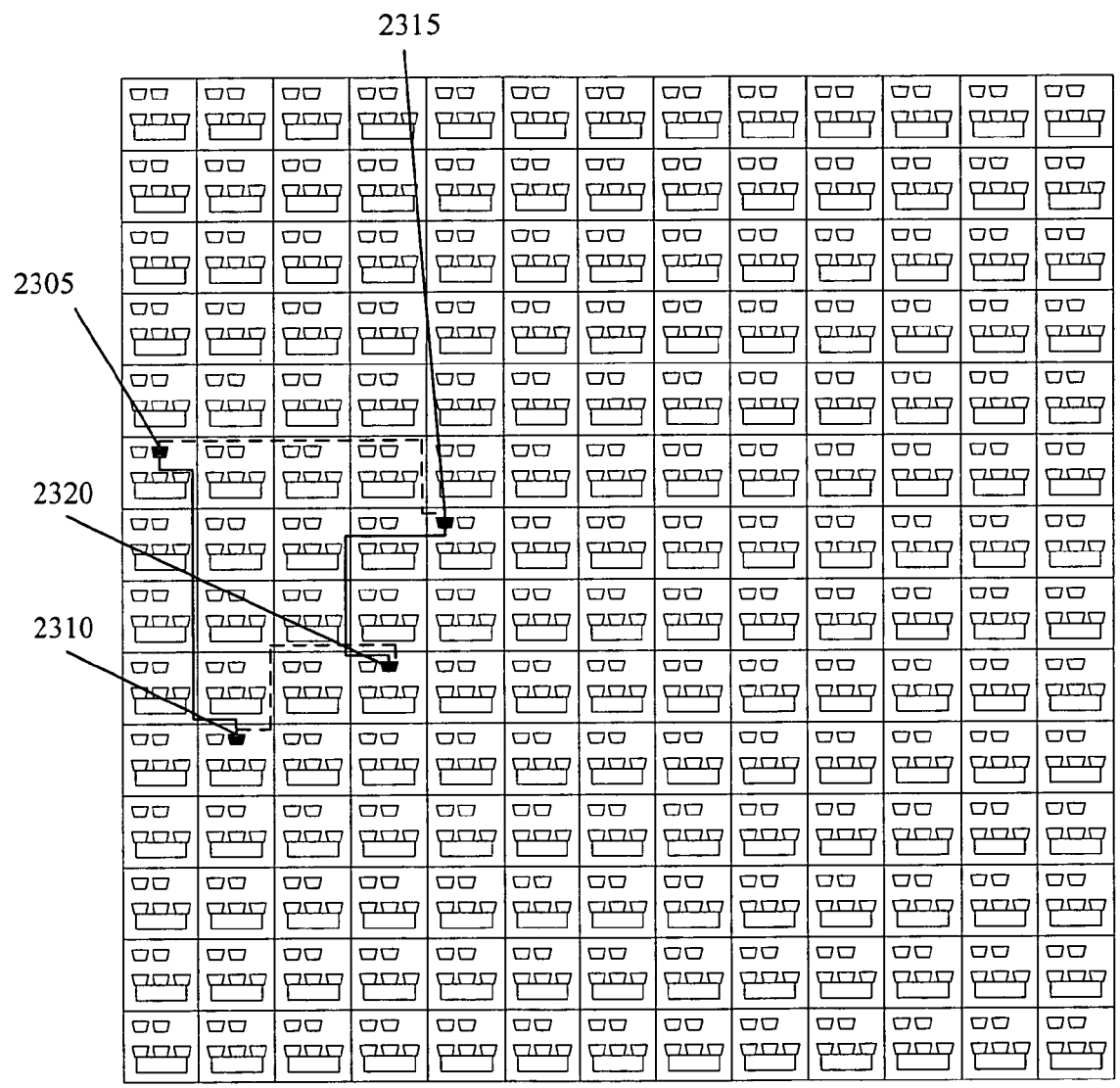
FIG. 23 illustrates a reconfigurable IC of some embodiments implementing logical master/slave RMUX locations.

FIG. 23 illustrates a reconfigurable IC of some embodiments implementing such logical RMUX locations. The IC may be programmed in a way that RMUX 2305 acts as the master RMUX and RMUX 2310 acts as the slave RMUX in sub-cycle one. The IC is then reconfigured to route the input of RMUX 2305 to RMUX 2315 and the input of RMUX 2310 to RMUX 2320 such that in sub-cycle two RMUX 2315 acts as the master RMUX and RMUX 2320 acts as slave RMUX. RMUXs 2305 and 2310 may be reused to do unrelated operations in subsequent sub-cycles. The Configurable IC may be reprogrammed to reallocate the master and/or slave RMUXs several more times prior to the next phase. The reconfigurable IC, therefore, provides flexibility to utilize physical RMUXs according to the needs for implementing the user design.

V. Examples of Different Uses for User Registers

As described above, user registers can be implemented to operate as either edge-triggered (i.e., single edge-triggered) or double-edge triggered flip-flops. Therefore, the user registers can be utilized wherever a flip-flop can be used. This section presents several specific examples of the use of user registers. The user registers, for example, may be used for retiming purposes. This retiming may be inherent to a pipeline defined within the user design, or the retiming may be done when mapping the user design to configurable logic and routing circuits of the configurable IC. The user registers may also be used to perform I/O operations.

Figure 24:
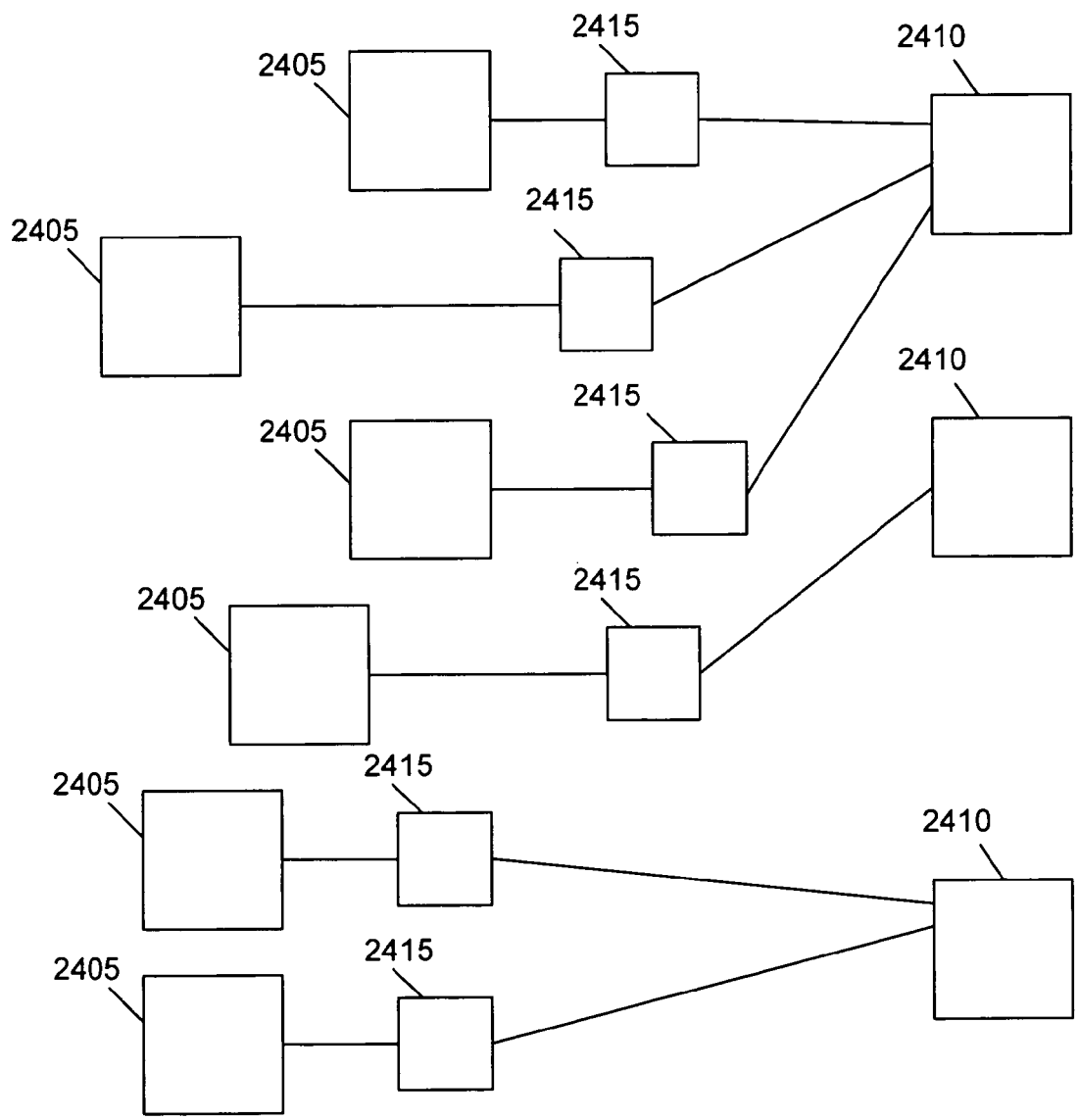
FIG. 24 conceptually illustrates several user registers utilized for retiming signals between logic circuits in some embodiments.

FIG. 24 conceptually illustrates an example for using user registers to perform retiming. Specifically, this figure shows several logic circuits (such as LUTs 2405) that perform some operations. These logic circuits have to send their outputs to other logic circuits (such as LUTs 2410). In order to perform retiming to ensure all output data from LUTs 2405 are received at the input of LUTs 2410 at predictable times, a group of user registers (such as 2415) can be utilized to receive the outputs of LUTs 2405, hold the data for a period of time, and route the data to the input of LUTs 2410 at rising or falling of a strobe signal.

Some embodiments utilize user registers to facilitate pipelining. Pipelining is a way of performing multiple sets of operations. To do pipelining, each set of operations is broken into subset operations. Different subset operations of each set are overlapped as they are performed. One such example is implementing a finite impulse response (FIR) filter. A FIR filter produces an output, Y, that is the weighted sum of the current and past values of an input, X. The value for the nth sample of Y can be expressed by the following equation (A):

$$Y_n = b_0 X_n + b_1 X_{n-1} + b_2 X_{n-2} + \ldots + b_j X_{n-j} = \sum_{i=0}^{j} b_i X_{n-i} \quad (A)$$

Figure 25:
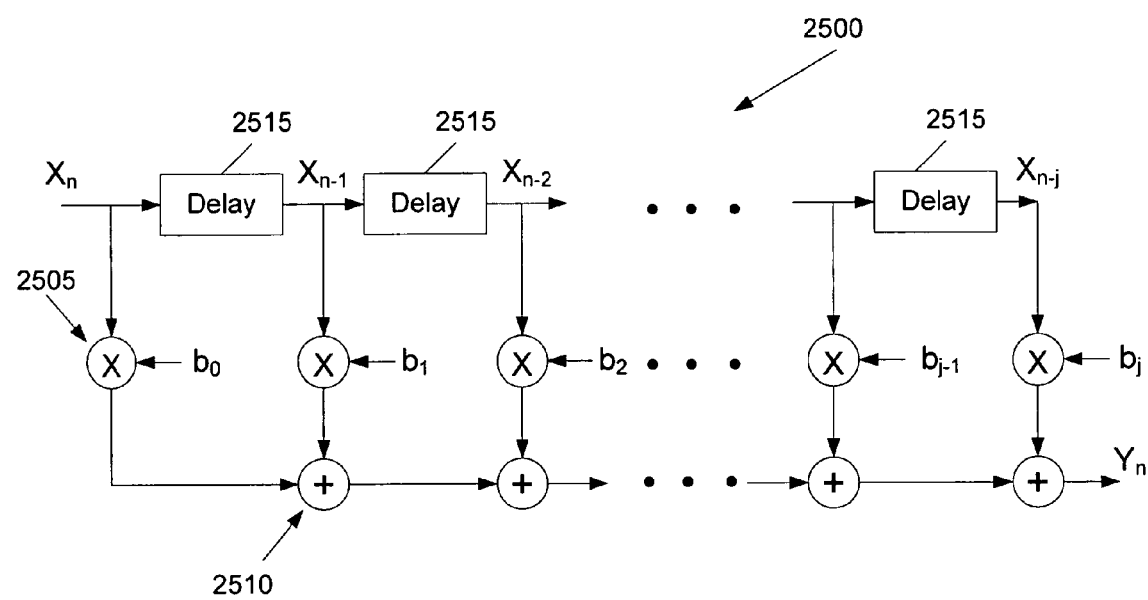
FIG. 25 illustrates logical structure of a Finite Impulse Response (FIR) filter.

FIG. 25 illustrates the logical structure of a FIR filter 2500 implementing expression (A) above. As shown, the output function $Y_n$ is implemented by utilizing a set of multipliers 2505, a set of adders 2510, and a set of storage elements 2515 for performing delays. The delays result in operating on prior samples of input, X (i.e., $X_{n-1}$, $X_{n-2}$, etc.).

Figure 26:
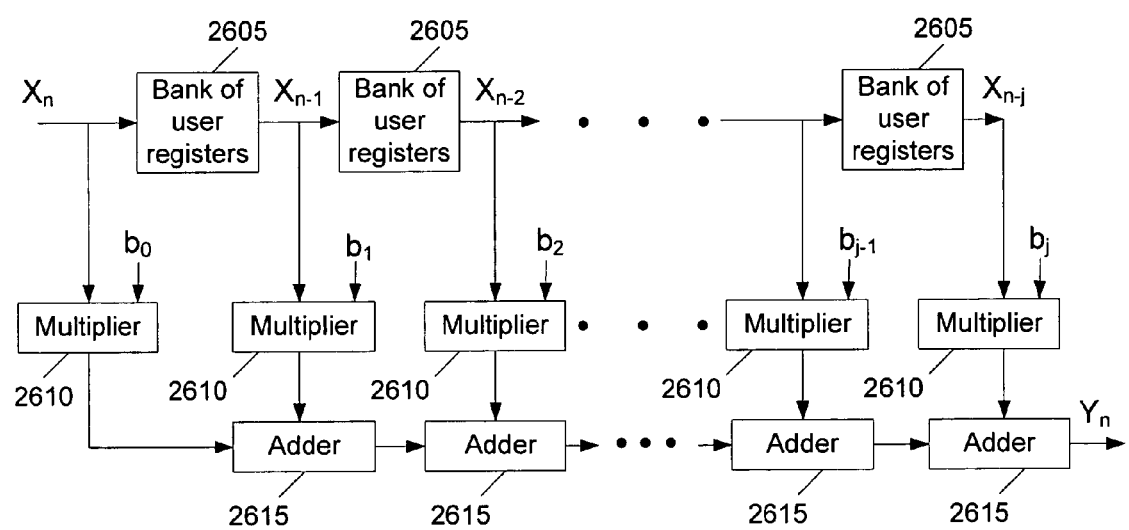
FIG. 26 conceptually illustrates how some embodiments utilize user registers to implement a FIR filter.

FIG. 26 conceptually illustrates how some embodiments implement the FIR filter 2500. As illustrated in FIG. 26, the delays are implemented by utilizing banks of users registers 2605. Each bank of user register holds the value of the input for a period of time to be used in a subsequent calculation. The output $Y_n$ of the FIR filter at a time n is the summation of all delayed samples ($X_{n-1}$) multiplied by the appropriate coefficients ($b_j$). Note that, if the user design cycle is divided into multiple sub-cycles and the multiplication and additions are not performed in one user design cycle, banks of user registers may be distributed throughout this pipeline to hold the results of operations for the next design cycle.

Figure 27:
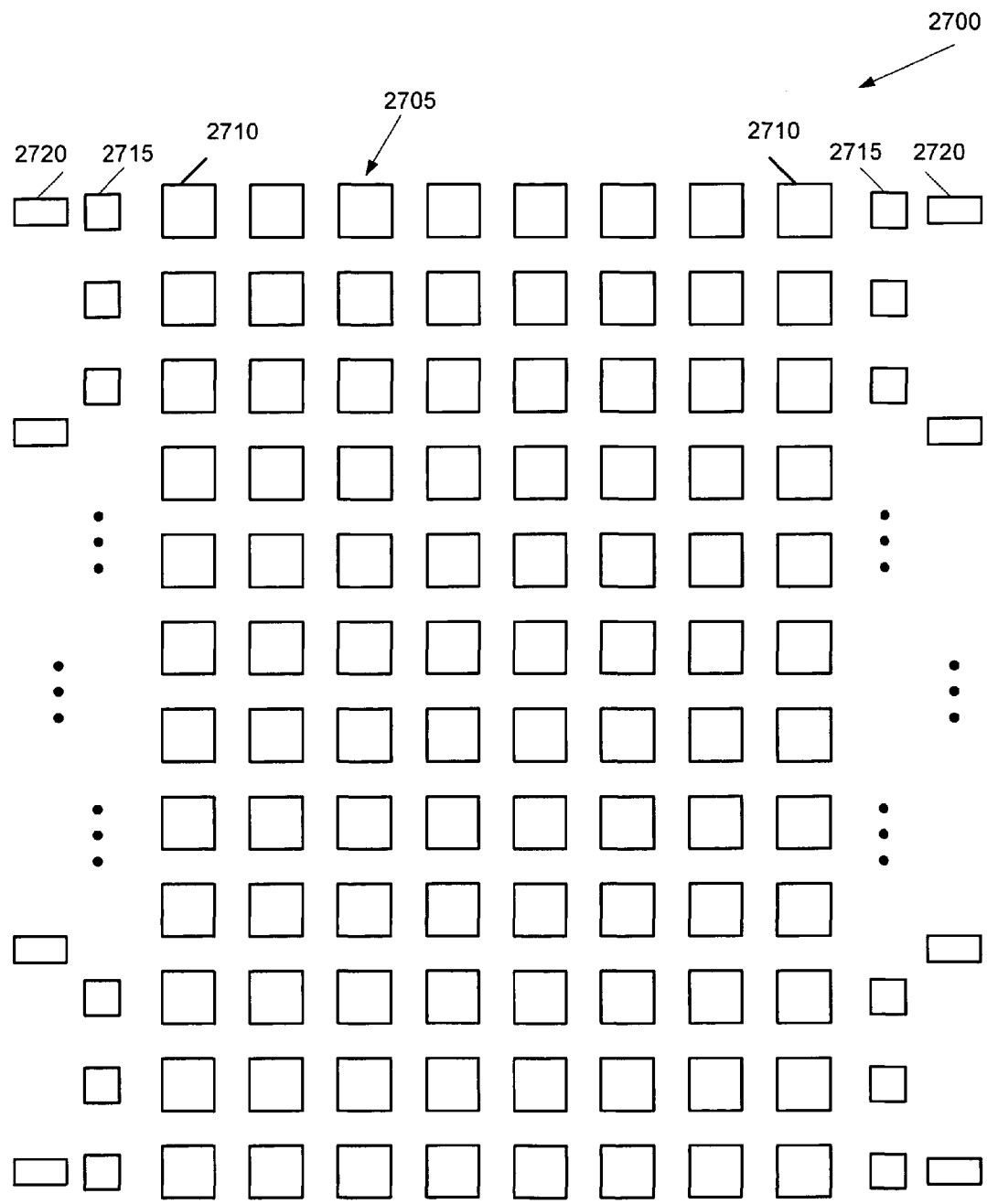
FIG. 27 conceptually illustrates a portion on a configurable IC of some embodiments.

In some embodiments, user registers implemented from RMUXs are used as a part of I/O circuitry. FIG. 27 conceptually illustrates one such embodiment. Specifically, this figure illustrates a circuit array 2705 of logic circuits 2710. This architecture also includes a number of user registers 2715 that are formed by configurable routing circuits and a number of I/O drivers 2720. In this figure, user registers are shown on the boundary to conceptually convey that these are user registers that are used for I/O function. However, in reality the routing resources that make these user registers don't need to be on the boundary but are located among configurable logic circuits 2710. The user registers used for I/O operations route data between the configurable circuits 2710 and circuits outside the array 2705 of logic circuits 2710 (e.g., circuits outside the IC or non-configurable circuits within the IC but outside of the array 2705). These user registers are communicatively coupled to the I/O drivers 2720 to send and receive data. Such data includes data that needs to be processed or passed along by the logic circuits 2710.

The above examples illustrate a few uses for user registers. As described above, however, a user register can be utilized where a flip-flop can be used. Therefore, a person of ordinary skill in the art should realize that the use of user registers is not limited to the above examples and many other applications of user registers are feasible.

VI. Replacing Circuit Design Elements with their Equivalents

A. Synthesis Process

IC design tools often include a synthesis tool which receives a description of the user design as input and generates the circuit design to implement the user design. Different synthesis tools accept different formats such as circuit diagrams, source code, Very High Speed Integrated Circuit Hardware Description Language (VHDL), Verilog Hardware Description Language, etc., for their input. In order to optimize the circuit design generated during synthesis, some embodiments replace certain design elements with their functionally equivalent design elements during synthesis.

Figure 28:
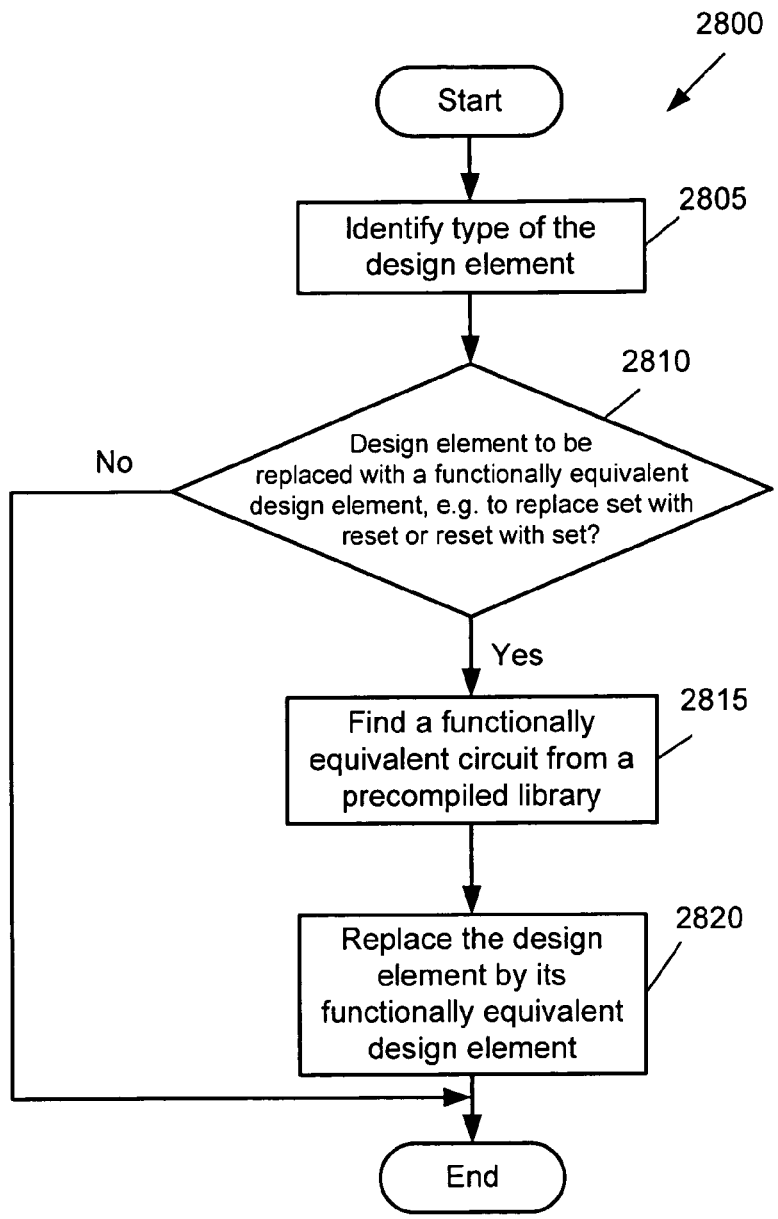
FIG. 28 conceptually illustrates a process that some embodiments use during synthesis to replace a design element with its equivalent.

FIG. 28 conceptually illustrates a process 2800 that some embodiments use during synthesis to replace a design element with its functionally equivalent design element. As shown in FIG. 28, the process 2800 first determines (at 2805) the type of the design element. For instance, the process may determine that the design element may require a set input or a reset input. Next at 2810, the process determines whether the design element may to be replaced with a functionally equivalent design element. For instance, if all previous design elements with set lines were replaced with design elements with reset lines and the current design element requires a set line, then the process determines that the design element has to be replaced with a functionally equivalent design element with a reset line. If the process determines (at 2810) that no replacement is required for the current design element, the process exits. Otherwise, the process proceeds to 2815 and finds a functionally equivalent circuit from a precompiled library. The process 2800 then replaces (at 2820) the current design element with the functionally equivalent design element found in the library. The process then exits.

B. Configurable ICs with only Set Line or Reset Line

Figure 29:
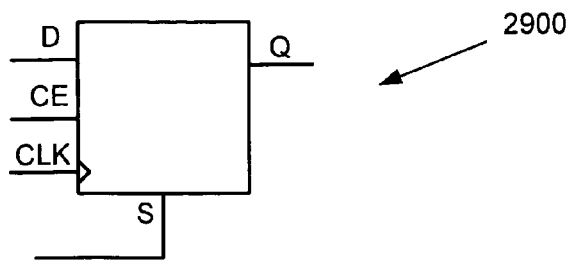
FIG. 29 illustrates a user register that has a set line.

As indicated above, some embodiments replace all design elements that have set or reset with their equivalents in a way that either all design elements have set or all have reset inputs. One such design element is a user register. FIG. 29 illustrates a user register 2900 that has an asynchronous set line (S). When the set line is asserted (either enable high or enable low), the output (Q) of the register is set to high. When the set line is not asserted and clock enable (CE) is asserted, the output (Q) will receive the value of the input (D) at the next active edge of the clock (CLK). As described above, use of a clock signal is not an absolute condition. Instead, a strobe signal may be used. This strobe signal can be driven from different sources. For instance, the strobe signal may be generated by circuit logic, driven directly or indirectly by the clock, or may be taken from configuration values stored in a set of storage elements. A person of ordinary skill in the art would realize that user register 2900 (and other user registers discussed in this section) can be implemented using the same techniques described in previous sections.

Figure 30:
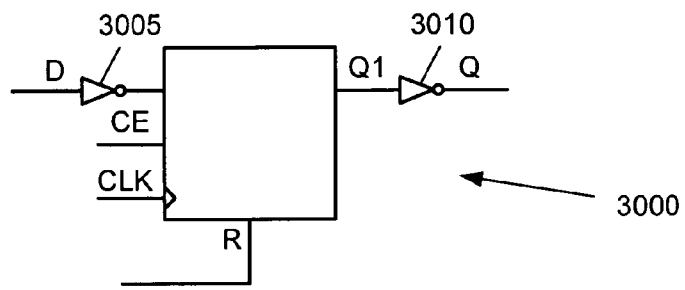
FIG. 30 illustrates a user register with a reset line and with its input and output lines inverted.

FIG. 30 illustrates a user register 3000 with a reset line (R) and with its input and output lines inverted. This register operates similar to register 2900. When the reset line is asserted, the output Q1 is set to low and the output Q of the register 3000 is set to high. When the reset line is not asserted and the click enable line (CE) is asserted, the output (Q) will have the same value as input (D) at the next active edge of the clock (CLK). The two registers 2900 and 3000 are, therefore, functionally interchangeable. It must be emphasized that some embodiments do further optimizations during or after synthesis. As a result, an inverter (such as 3005 or 3010) may be eliminated during a subsequent optimization step if it is immediately connected to another inverter either before or after it in the design circuit.

Figure 31:
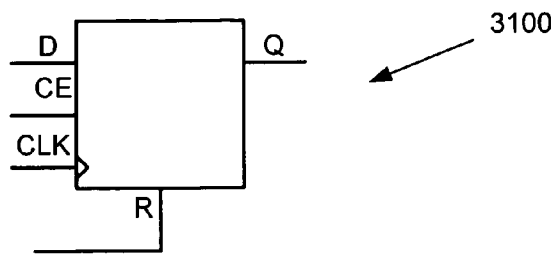
FIG. 31 illustrates a user register with a reset line.
Figure 32:
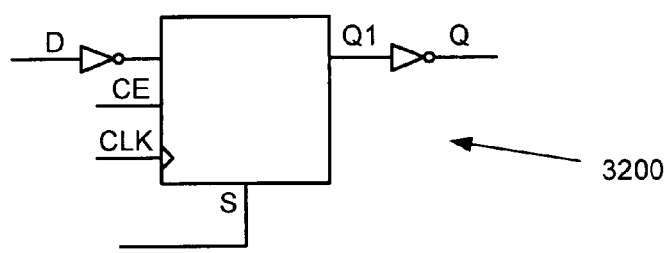
FIG. 32 illustrates a user register with a set line and with its input and output lines inverted.

Similarly, FIG. 31 illustrates a user register 3100 with a reset line (R). When this reset line is enabled, the output (Q) is forced to low. When the reset line is not asserted and enable (CE) is asserted, the output (Q) will receive the value of the input (D) at the next active edge of the clock. FIG. 32 illustrates a user register 3200 with a set line (S) and with its input and output lines inverted. When the set line is asserted, the output Q1 is set to high and the output Q of the user register is set to low. When the set line is not asserted and the enable line (CE) is asserted, the output (Q) will have the same value as input (D) at the next active edge of the clock. The two registers 3100 and 3200 are, therefore, functionally interchangeable.

Figure 33:
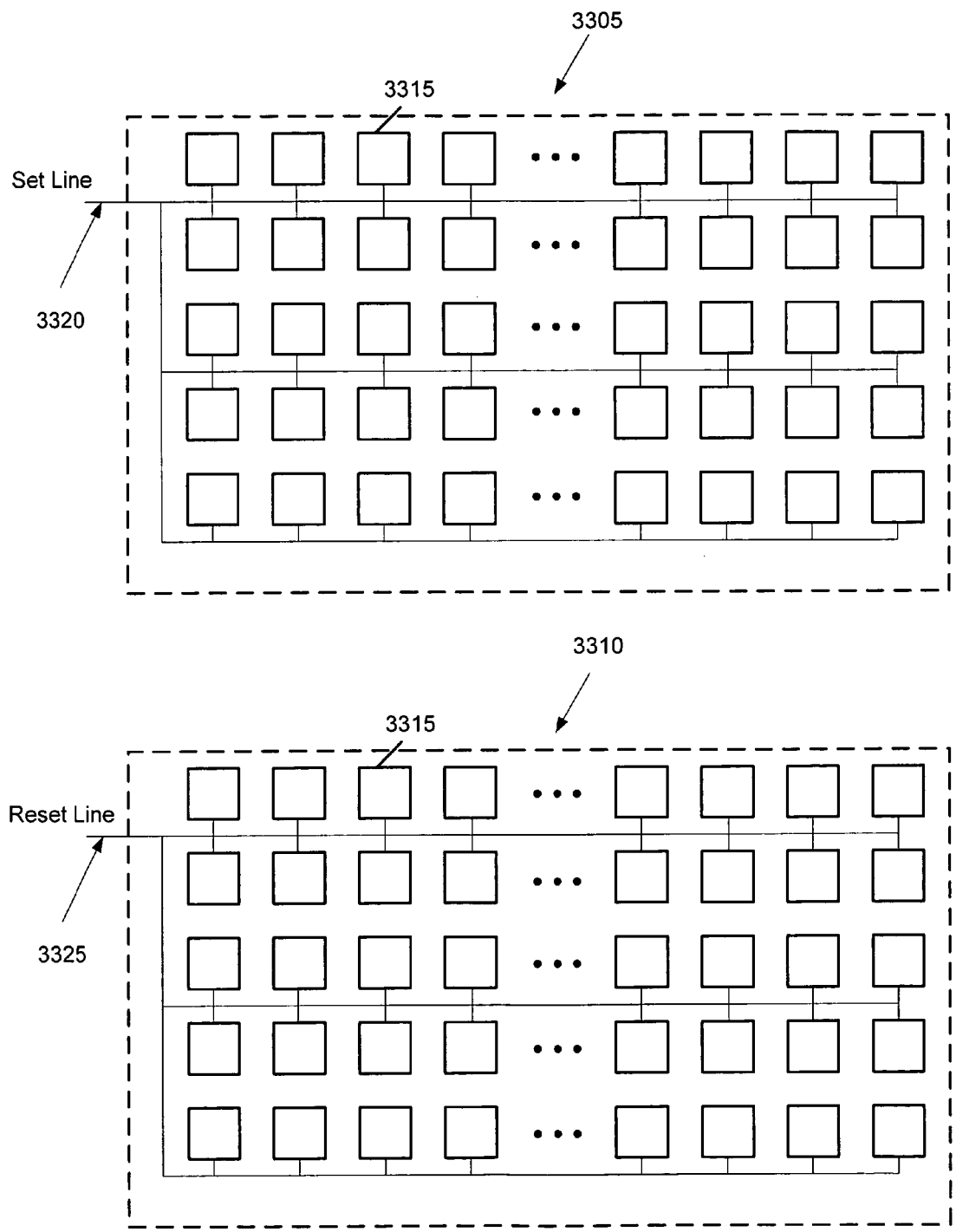
FIG. 33 illustrates two ICs each with only one set or reset line.

As described in more detail above, some embodiments replace every design element that requires a certain type of control such as a reset (or set), with a functionally equivalent design element that performs the same function using a different control such as set (or reset). FIG. 33 conceptually illustrates two configurable ICs 3305 and 3310. These ICs 3305 and 3310 have several logic and interconnect circuits 3315. As shown, configurable IC 3305 is designed to have only a set line 3320 distributed to its circuits, while configurable IC 3310 is designed to have only a reset line 3325 distributed to its circuits.

Substituting design elements to have only set or reset lines has several advantages. For instance, for design fabrics that actually have set and reset lines, it eliminates the need to have both lines distributed throughout the design fabric. Also, having either set or reset functions eliminates the need for implementing a configuration bit to indicate to design elements what to do when a set/reset signal is supplied. Having only set or reset also reduces the need to initialize state elements to define whether a register is a set or a reset register. Some embodiments perform an automatic power up reset. Additional saving in logic circuits may be realized by connecting the reset (or inverted set) signals to the power up reset if permitted by the user.

VII. Electronics System

Figure 34:
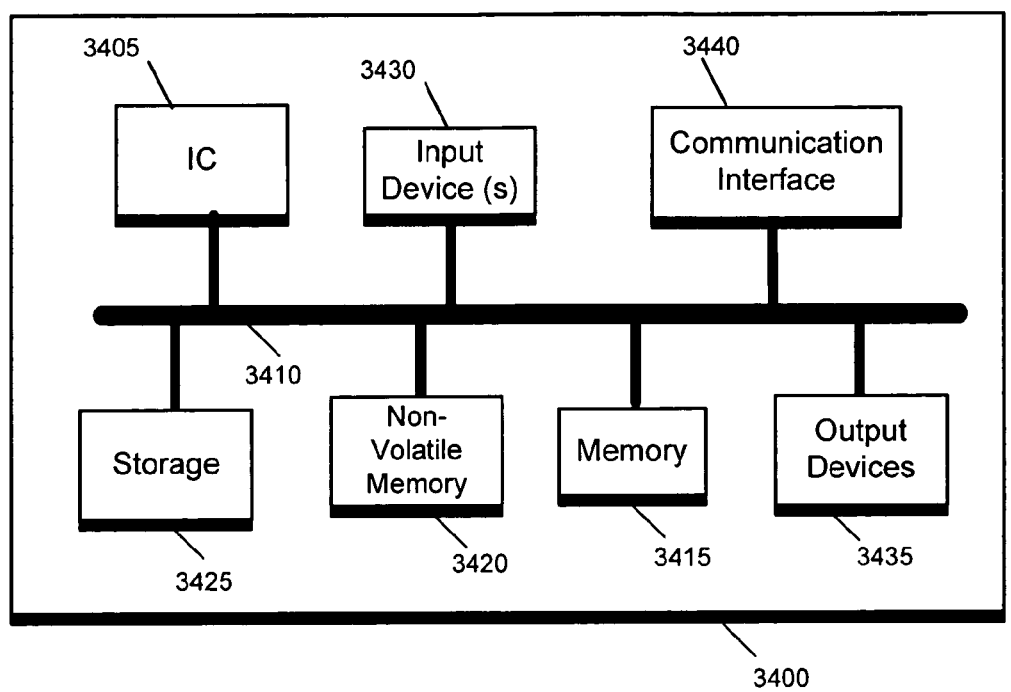
FIG. 34 conceptually illustrates an example of an electronics system that has an IC, which includes one of the invention's configurable circuit arrangements.

FIG. 34 conceptually illustrates a more detailed example of an electronics system 3400 that has an IC 3405, which implements some of the above described circuitry and operations (such as user registers implemented with RMUXs, user registers in a reconfigurable IC, and circuit elements replaced with their equivalents). The system 3400 can be a stand-alone computing or communication device, or it can be part of another electronic device. As shown in FIG. 34, the system 3400 not only includes the IC 3405, but also includes a bus 3410, a system memory 3415, a read-only memory 3420, a storage device 3425, input devices 3430, output devices 3435, and communication interface 3440. In some embodiments, the non-volatile memory 3420 stores configuration data and re-loads it at power-up. Although the non-volatile memory 3420 is shown outside of the IC 3405, in some embodiments, the non-volatile memory is either on the same die or the same package as the IC 3405.

The bus 3410 collectively represents all system, peripheral, and chipset interconnects (including bus and non-bus interconnect structures) that communicatively connect the numerous internal devices of the system 3400. For instance, the bus 3410 communicatively connects the IC 3405 with the read-only memory 3420, the system memory 3415, and the permanent storage device 3425.

From these various memory units, the IC 3405 receives data for processing and configuration data for configuring the IC's configurable logic and/or interconnect circuits. When the IC 3405 has a processor, the IC also retrieves from the various memory units instructions to execute. The non-volatile memory 3420 stores static data and instructions that are needed by the IC 3405 and other modules of the system 3400. The storage device 3425, on the other hand, is read-and-write memory device. This device is a non-volatile memory unit that stores instruction and/or data even when the system 3400 is off. Like the storage device 3425, the system memory 3415 is a read-and-write memory device. However, unlike storage device 3425, the system memory is a volatile read-and-write memory, such as a random access memory. The system memory stores some of the instructions and/or data that the IC needs at runtime.

The bus 3410 also connects to the input and output devices 3430 and 3435. The input devices enable the user to enter information into the system 3400. The input devices 3430 can include touch-sensitive screens, keys, buttons, keyboards, cursor-controllers, microphone, etc. The output devices 3435 display the output of the system 3400.

Finally, as shown in FIG. 34, bus 3410 also couples system 3400 to other devices through a communication interface 3440. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

We claimed:

1. A configurable integrated circuit ("IC") comprising:
   a plurality of reconfigurable circuits, each of the plurality of reconfigurable circuits for reconfigurably performing a plurality of operations in a plurality of reconfiguration cycles,
   wherein a first reconfigurable circuit is an interconnect/storage circuit that performs a storage operation during a first reconfiguration cycle and perform a non-storage operation during a second reconfiguration cycle,
   wherein a second reconfigurable circuit is an interconnect/storage circuit that performs a non-storage operation during the first reconfiguration cycle and perform a storage operation during the second reconfiguration cycle, and wherein the first and second reconfigurable circuits are communicatively coupled to operate as a data register during the first and second reconfiguration cycles.

2. The configurable IC of claim 1, wherein a reconfiguration cycle is an operational cycle of the configurable IC during which the configuration of a particular reconfigurable circuit can be different than the configuration of the particular reconfigurable circuit during another reconfiguration cycle.

3. The configurable IC of claim 1, wherein the second reconfigurable circuit performs a storage operation during at least two consecutive reconfiguration cycles.

4. The configurable IC of claim 1, wherein the data register is initialized by an initialization signal that initializes the first and second reconfigurable circuits to a known value.

5. The configurable IC of claim 1, wherein the data register operates at a data register cycle, wherein the data register cycle is longer than the reconfiguration cycle.

6. The configurable IC of claim 1, wherein the first and second reconfigurable circuits are located at different physical interconnect/storage locations.

7. The configurable IC of claim 1, wherein the first and second reconfiguration cycles are temporally consecutive reconfiguration cycles.

8. The configurable IC of claim 1, wherein a third reconfigurable circuit is communicatively coupled with the first and second reconfigurable circuits to operate as the data register.

9. A method comprising:
at a first reconfiguration cycle, performing a storage operation at a first reconfigurable circuit and a non-storage operation at a second reconfigurable circuit; and
at a second reconfiguration cycle, performing a non-storage operation at the first reconfigurable circuit and a storage operation at the second reconfigurable circuit,
wherein the first and second reconfigurable circuits are reconfigurable circuits in an integrated circuit (IC) for reconfigurably performing a plurality of operations in a plurality of reconfiguration cycles, wherein the first and the second reconfigurable circuits are communicatively coupled to operate as a data register in the first and second reconfiguration cycles.

10. The method of claim 9, wherein a reconfiguration cycle is an operational cycle of the IC during which the configuration of a particular reconfigurable circuit can be different than the configuration of the particular reconfigurable circuit during another reconfiguration cycle.

11. The method of claim 9, wherein the data register operates at a data register cycle, wherein the data register cycle is longer than the reconfiguration cycle.

12. The method of claim 9, wherein the first and second reconfiguration cycles are temporally consecutive reconfiguration cycles.

13. The method of claim 9, wherein a third reconfigurable circuit is communicatively coupled with the first and second reconfigurable circuits to operate as the data register.

14. The method of claim 9, wherein the first and second reconfigurable circuits are communicatively coupled by a lookup table (LUT) in the first and second reconfiguration cycles.

15. A non-transitory computer-readable medium storing a computer program for configuring an integrated circuit ("IC"), the IC comprising a plurality of reconfigurable circuits, each of the plurality of reconfigurable circuits for reconfigurably performing a plurality of operations in a plurality of reconfiguration cycles, the program comprising sets of instructions for:
configuring a first reconfigurable circuit to perform a storage operation during a first reconfiguration cycle and a non-storage operation during a second reconfiguration cycle; and
configuring a second reconfigurable circuit to performs a non-storage operation during the first reconfiguration cycle and perform a storage operation during the second reconfiguration cycle, wherein the first and the second reconfigurable circuits are communicatively coupled to operate as a data register in the first and second reconfiguration cycles.

16. The non-transitory computer-readable medium of claim 15, wherein the data register operates at a data register cycle, wherein the data register cycle is longer than the reconfiguration cycle.

17. The non-transitory computer-readable medium of claim 15, wherein the first and second reconfiguration cycles are temporally consecutive reconfiguration cycles.

18. The non-transitory computer-readable medium of claim 15, wherein a reconfiguration cycle is an operational cycle of the IC during which the configuration of a particular reconfigurable circuit can be different than the configuration of the particular reconfigurable circuit during another reconfiguration cycle.

19. The non-transitory computer-readable medium of claim 15, wherein the program further comprises a set of instructions for configuring a third reconfigurable circuit to communicatively couple the first and second reconfigurable circuit during the first and second reconfigurable cycles to operate as the data register.

20. The non-transitory computer-readable medium of claim 19, wherein the third reconfigurable circuit is a lookup table (LUT).

* * * * *